United States Patent [19]
Yamauchi et al.

[11] Patent Number: 5,955,876
[45] Date of Patent: Sep. 21, 1999

[54] BOARD POSITIONING APPARATUS

[75] Inventors: Hiroshi Yamauchi, Hirakata; Shoriki Narita, Kadoma; Hideo Hongo, Yokohama, all of Japan

[73] Assignee: Matsushita Electric Industrial Co., Ltd., Osaka, Japan

[21] Appl. No.: 08/825,499

[22] Filed: Mar. 31, 1997

Related U.S. Application Data

[62] Division of application No. 08/435,616, May 5, 1995, Pat. No. 5,648,729.

[30] Foreign Application Priority Data

May 6, 1994 [JP] Japan .................................. 6-94557

[51] Int. Cl.⁶ .................................................. G01R 31/02
[52] U.S. Cl. ...................................... 324/158.1; 324/758
[58] Field of Search .................................... 324/754, 758, 324/158.1; 414/416, 795, 935; 269/55, 63

[56] References Cited

U.S. PATENT DOCUMENTS

| | | | |
|---|---|---|---|
| 3,826,483 | 7/1974 | Siegel | 269/203 |
| 4,801,131 | 1/1989 | Bagley | 269/75 |
| 5,094,584 | 3/1992 | Bullock | 324/754 |
| 5,510,724 | 4/1996 | Itoyama et al. | 414/416 |
| 5,530,374 | 6/1996 | Yamaguchi | 324/758 |

Primary Examiner—Ernest Karlsen
Attorney, Agent, or Firm—Wenderoth, Lind & Ponack, L.L.P.

[57] ABSTRACT

A board positioning method includes the steps of selecting one of a plurality of positioning sections or stations for positioning a particular type of board located in a specified position. The method allows positioning different types of boards in specified positional relationships by locating only a positioning section corresponding to the board to be positioned, so that the positioning section faces the board located in the specified position. The positioning section is moved into the specified location by means of a support member. Thereby, positioning various types of the boards in a specified common position is possible without the need to make adjustments to a single positioning station.

23 Claims, 16 Drawing Sheets

5,955,876

BOARD POSITIONING APPARATUS

This is a divisional application of Ser. No. 08/435,616, filed May 5, 1995, now U.S. Pat. No. 5,648,729.

BACKGROUND OF THE INVENTION

The present invention relates to a board positioning method and apparatus for use in performing printing on a board, mounting of electronic components, a variety of operations such as inspection and adjustment, measurement for adjustment, and the like for manufacturing an electronic circuit board.

Conventionally, in a process of performing mounting, inspection, and adjustment for manufacturing a board as a product, there has been used an apparatus as shown in FIG. 18 or FIG. 19.

In the apparatus shown in FIG. 18, a board 501 is transferred along transfer rails 502, made to stop in a specified position by means of a stopper (not shown), and subjected to the aforementioned various operations in the position. Meanwhile, guide rails 503 are provided with a reference side positioning pin 505 and a movable side positioning pin 506 which are engaged with the guide rails 503 by means of a guide block 504 and a screw 514 for screwing the guide block 504. With the reference side positioning pin 505 secured in a reference position, the movable side positioning pin 506 is moved to a position corresponding to the type of the board 501 and then secured. The reference side positioning pin 505 and the movable side positioning pin 506 are moved up by vertical movement cylinders 507 and 508 and then inserted into position regulating holes 509 and 510 of the board 501 retained, thereby positioning the board for the aforementioned various operations. In order to support the positioned board 501 after the positioning is completed, a support unit 512 having a support pin 511 is moved up by a vertical movement cylinder 513 to support the board 501 in a position and condition corresponding to the type of the board by means of the support pin 511 conforming to the type of the board. The support pin 511 is replaced every time the type of the board 501 changes, thereby satisfying the corresponding support position-and condition.

The apparatus shown in FIG. 19 is designed to measure a board 501 to be positioned in the same manner as described above, and includes a measurement device 515. The measurement device 515 is provided with a contact probe pin 516 corresponding to the type of the board 501 and the type of measurement provided in a position corresponding to the type of the board 501 and the type of measurement. The measurement device 515 is moved up by a vertical movement cylinder 517 to put the contact probe pin 516 in contact with the board 501 in a required condition in a position corresponding to the type of a rear surface of the board 501 and the type of measurement, thereby allowing the required measurement processes to be performed. The measurement device 515 is removed and replaced every time the type of the board 501 is changed.

However, in each of the apparatuses shown in FIGS. 18 and 19, the positioning pin for positioning the board 501 in the specified position is required to be adjusted in position every time the type of the board 501 is changed, which is troublesome work which takes a long time to complete. During the long time, the works to be effected on the board 501 are interrupted. Therefore, when the type of the board 501 to be processed is changed in a daily normal working time, such a change exerts a significant influence on the productivity in the normal working time. When such a change is performed several times, the productivity is reduced significantly.

Furthermore, when the support pin 516 and the measurement device 515 which are required to be replaced or remounted according to the type of the board 501 are incorporated, a further procedure and more time are required resulting in further reducing the productivity in proportion to the incorporation of them.

SUMMARY OF THE INVENTION

Accordingly, it is a primary object of the present invention to solve the aforementioned problems and provide a board positioning method and apparatus capable of improving the productivity more than that of the conventional apparatus in correspondence with a change of the type of the board in a simple manner and in a short time.

In accomplishing these and other objects, according to one aspect of the present invention, there is provided a board positioning method comprising the steps of:

preparatorily putting each of a plurality of positioning sections or stations for positioning a board located in a specified position in a specified positional relationship relative to a particular type of board.

Positioning the board to be positioned by moving selected a positioning section or station corresponding to the board to be positioned so that the station faces the board located in the specified position, the section is moved by means of a support member, thereby positioning one of various types of the boards in a specified common position.

According to another aspect of the present invention, there is provide a board positioning apparatus comprising:

a plurality of positioning sections for positioning different types of boards in specified positional relationships; and a movement means for moving at need the plural number of positioning sections so as to position any one of the positioning sections in a specified common position for positioning the board.

BRIEF DESCRIPTION OF THE DRAWINGS

These and other objects and features of the present invention will become clear from the following description taken in conjunction with the preferred embodiments thereof with reference to the accompanying drawings, in which.

DETAILED DESCRIPTION OF THE PREFERRED EMBODIMENTS

Figure 1:
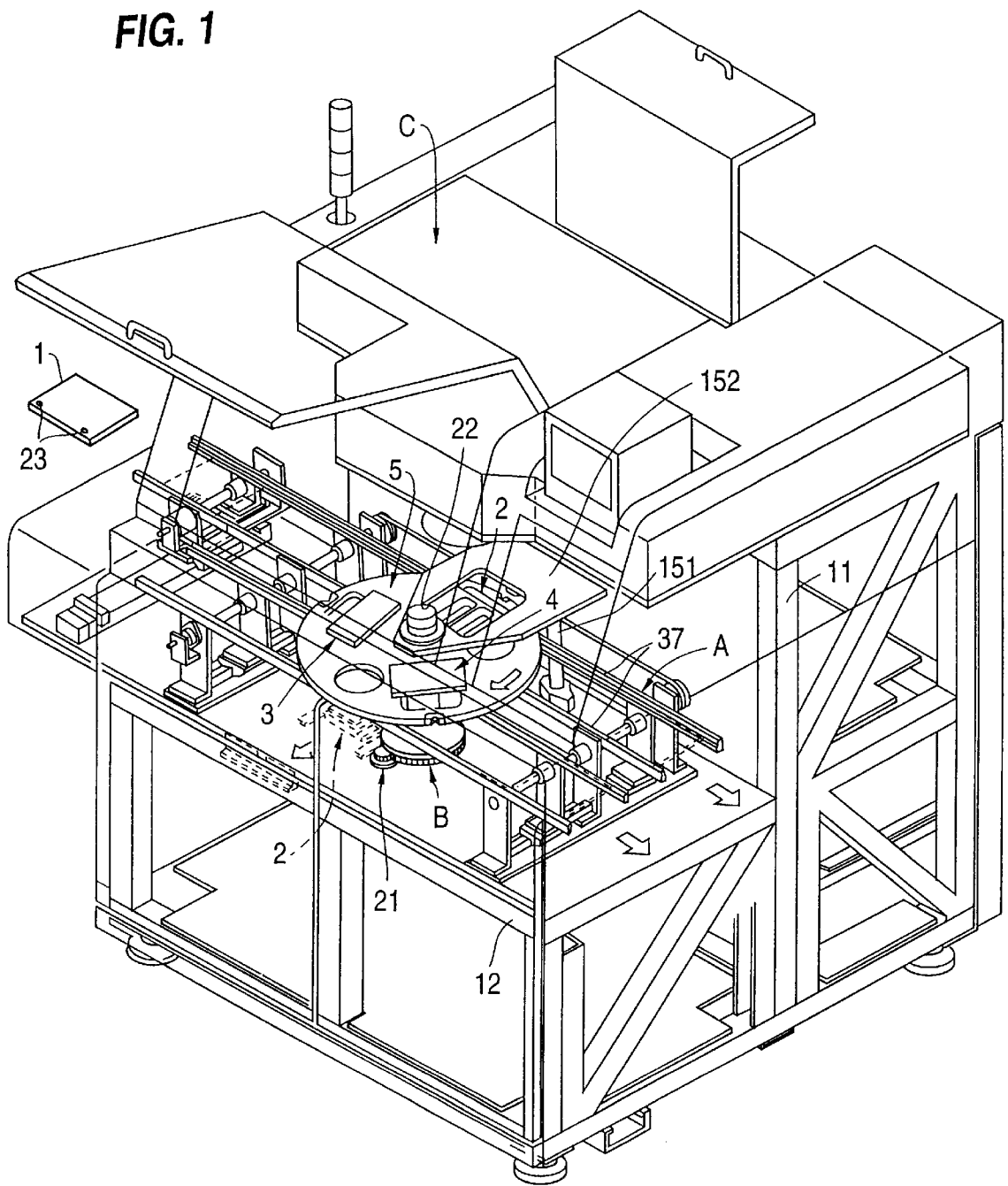
FIG. 1 is a perspective view of a preferred embodiment of the present invention showing a laser processing apparatus.

Before the description of the present invention proceeds, it is to be noted that like parts are designated by like reference numerals throughout the accompanying drawings.

FIGS. 1 through 8 show a board positioning method and apparatus for carrying out the methods according to a preferred embodiment of the present invention. The apparatus is a laser processing apparatus which uses a board 1 mounted with an electronic circuit, and trims resistors, capacitors, and coils of the electronic components mounted on the board by means of a laser beam so that specified characteristic values can be achieved while putting the components in an operating condition sufficient for performing a characteristic test, i.e., performing a so-called function trimming and the like.

The present apparatus has an approximate structure as shown in FIG. 1 in which a base plate 12 is fixed at a front portion of a main body frame 11, and on the base plate 12 are mounted transfer means A for transferring a variety of boards 1 to the aforementioned specified position to subject the board to various operations and thereafter transferring the board therefrom, and positioning means B for performing the aforementioned positioning of the board 1 which has been transferred to the aforementioned specified position to be subjected to a variety of works. Further, a work head C for performing laser processing on the positioned board 1 is provided above the specified position as mounted to an upper portion of the main body frame 11.

Figure 2:
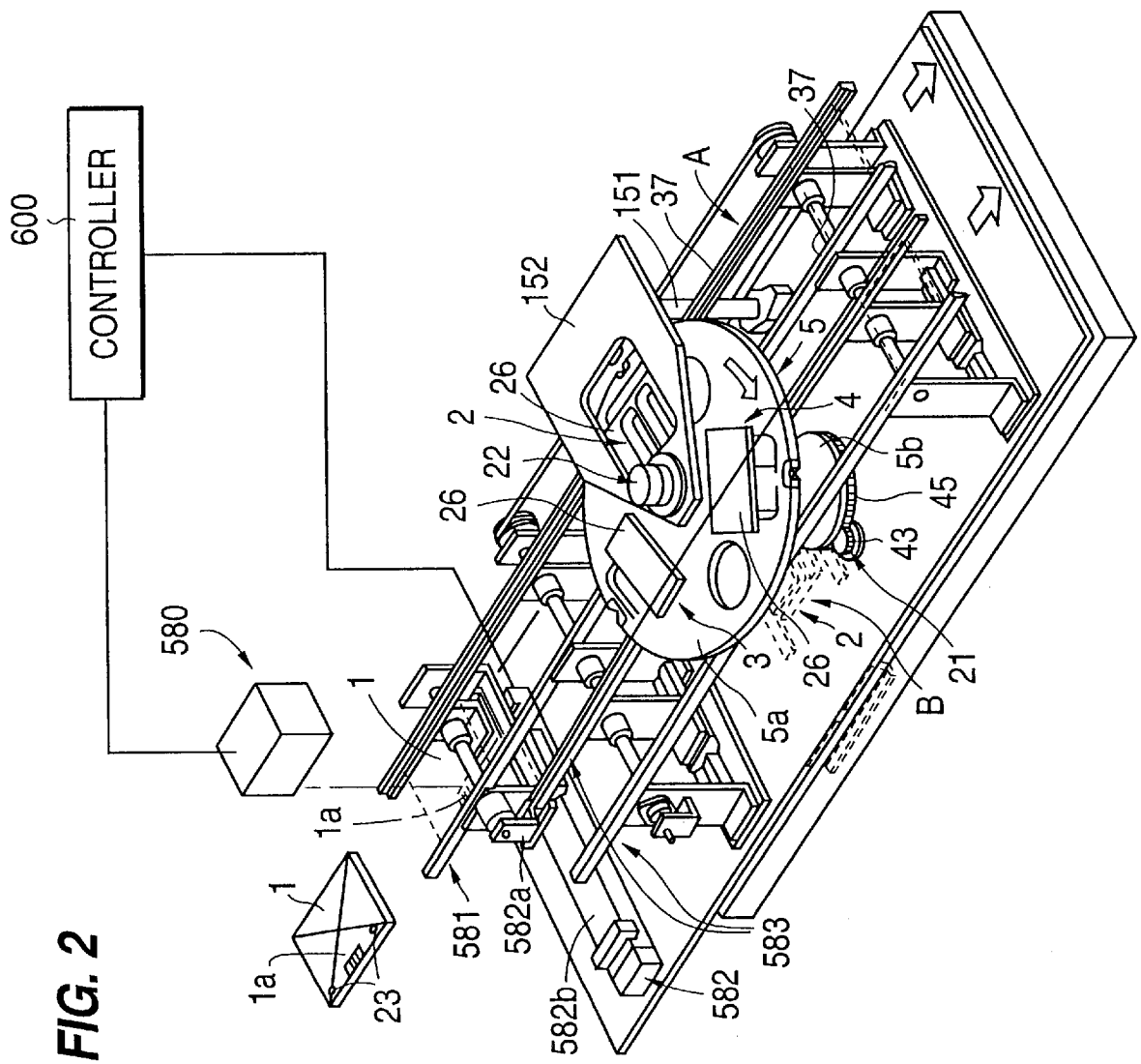
FIG. 2 is a perspective view showing a board transfer means and a board positioning mechanism section of the apparatus shown in FIG. 1.
Figure 3:
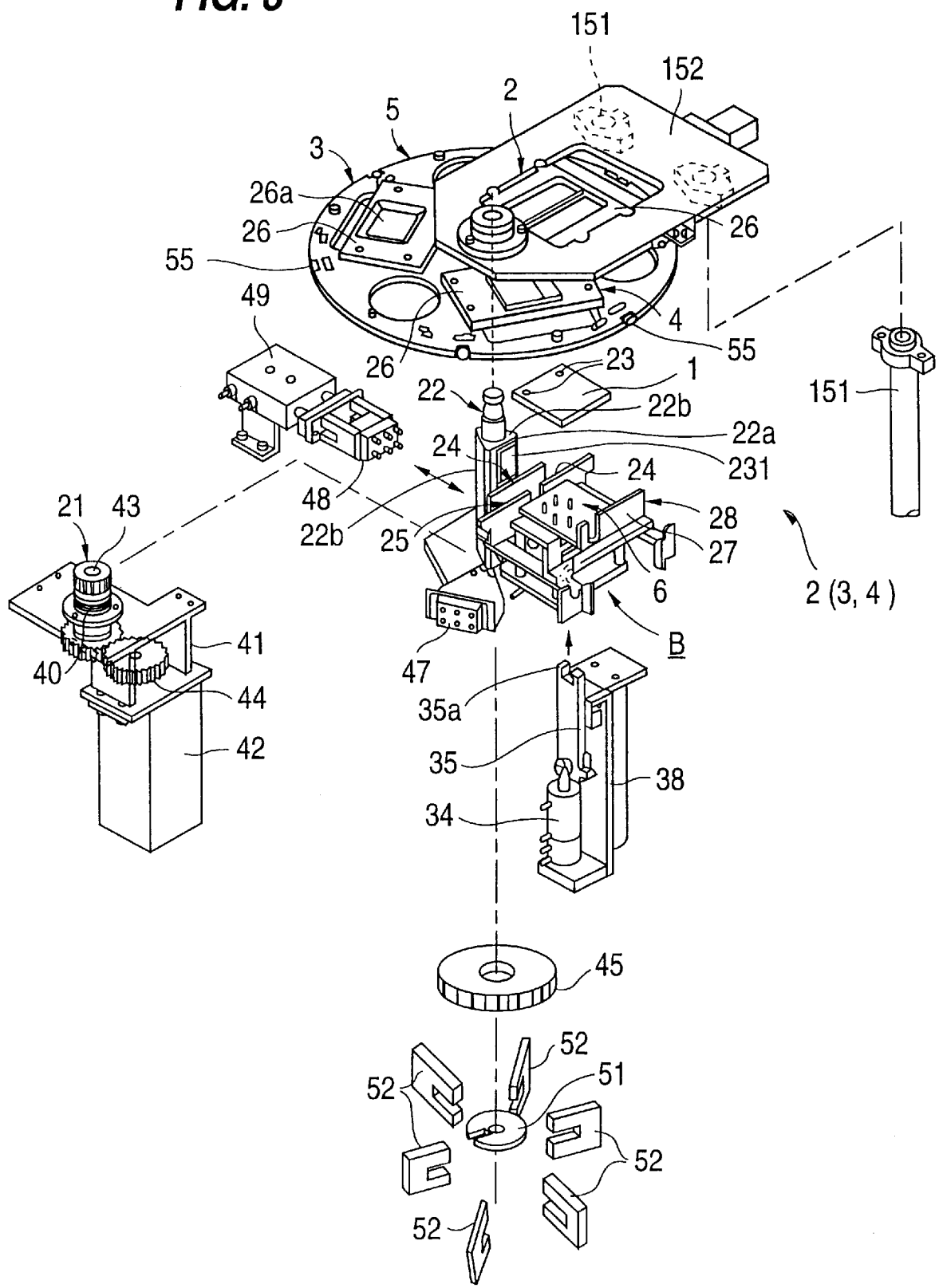
FIG. 3 is an exploded perspective view showing the board positioning mechanism section of the apparatus shown in FIG. 1.
Figure 4:
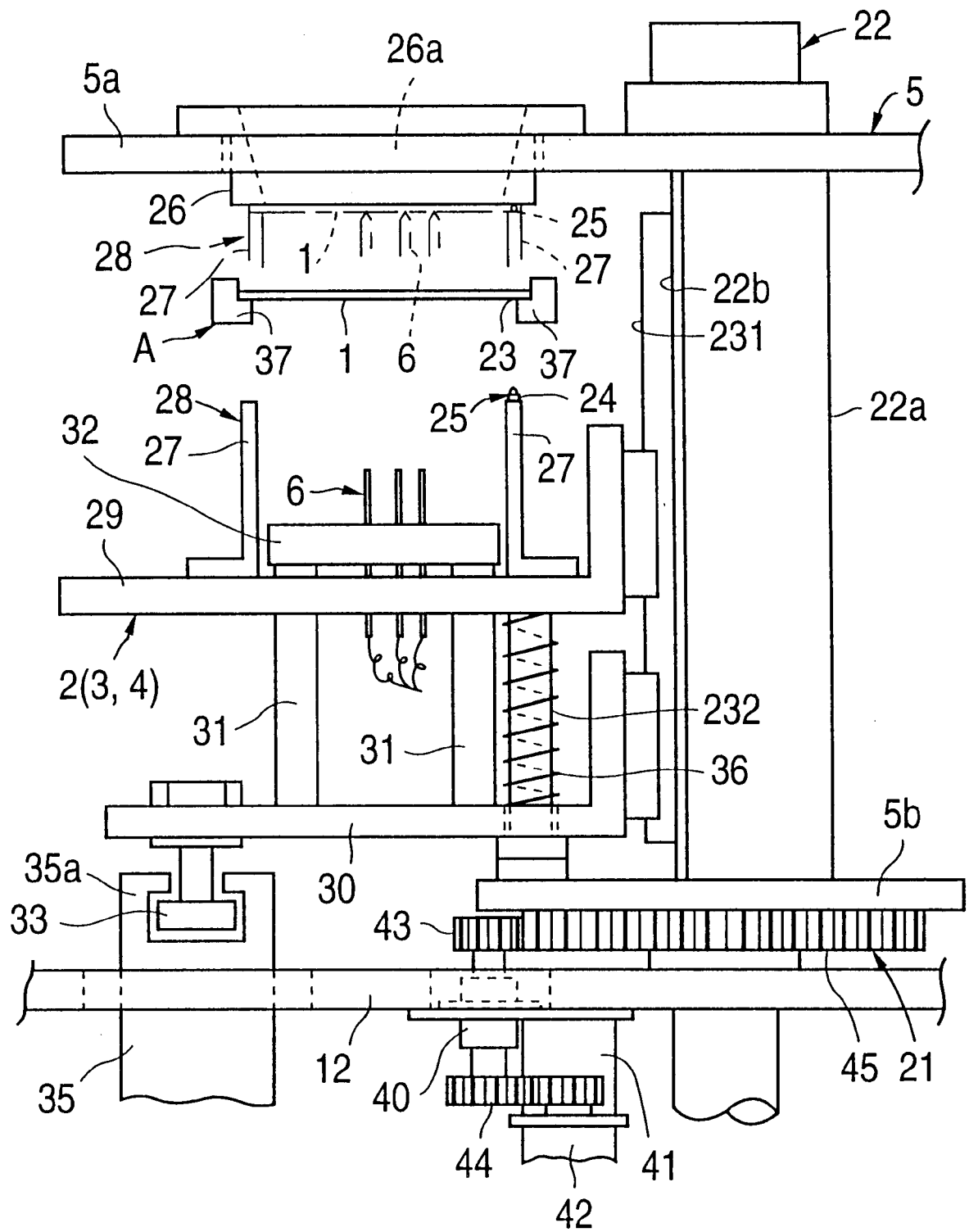
FIG. 4 is a side view showing a part of the board positioning mechanism section of the apparatus shown in FIG. 1.

In order to effect the aforementioned laser processing on the board 1 of a varied type, a positioning method as follows is adopted. For example, a plurality of positioning sections or stations 2 through 4 position the board 1 located in a specified position as shown in FIGS. 3 and 4 in a specified positional relationship between the board 1 and the positioning section itself. The positioning sections 2 through 4 are preparatorily put in a condition where different types of boards 1 can be positioned in a specified positional relationship, and the positioning sections 2 through 4 are moved by means of a support member 5. With the above-mentioned operation, a positioning section corresponding to the board 1 to be positioned, e.g., only the positioning section 2 in FIGS. 1 through 4 is made to face the board 1 located in the specified position to position the board 1, thereby positioning the board 1 of each type in a common specified position.

With the above-mentioned arrangement, by using each of the plural number of positioning sections 2 through 4 while preparatorily putting the positioning sections in a condition where the different types of boards 1 can be positioned in a specified positional relationship between each of the boards 1 and the positioning section itself, even when the type of the board 1 is changed, the change can be managed easily in a short time while eliminating a complicated work for making the positioning structure of the positioning section itself correspond to the change. Furthermore, by moving the positioning sections 2 through 4 by means of the support member 5 the positioning section corresponding to the type of the board 1 to be positioned, e.g., only the positioning section 2 in FIGS. 1 through 4 is made to face the board 1 located in the specified position to allow the board 1 of each type to be positioned in the common specified position while not requiring the operator to mount, dismount, or carry the positioning sections 2 through 4. Therefore, changing the type of the board 1 can be managed easily in a short time, thereby allowing the productivity to be improved over that of the conventional case.

Furthermore, there is concurrently adopted a method of preparatorily providing. each of the positioning sections 2 through 4 with a measurement device 6 corresponding to the type of the board 1 to be positioned in the aforementioned positioning method in a manner as shown in FIGS. 3 and 4, and operating the measurement device 6 on the positioned board 1 to measure the board 1.

By thus preparatorily providing each of the positioning sections 2 through 4 with the measurement device 6 corresponding to the type of the board 1 to be positioned in the aforementioned positioning method, the measurement of the positioned board 1 achieved by operating the measurement device 6 on the positioned board 1 can be instantaneously achieved without any special operation of the measurement device 6 provided preparatorily in correspondence with the type of the board 1 in the positioning section which is selectively used, e.g., the positioning section 2 in FIGS. 1 through 4. Therefore, even when the type of the board is changed in positioning the board of each type in the specified position and measuring the board in the position and condition corresponding to the type of the board, the change can be obtained by selectively using the positioning sections 2 through 4.

The apparatus of the present preferred embodiment is provided with a movement means 21 for positioning any one of the positioning sections 2 through 4, e.g., the positioning section 2 in FIGS. 1 through 4 in the common specified position for positioning the board 1 by moving the support member 5 for supporting the plural number of positioning sections 2 through 4. With the above-mentioned arrangement, for the aforementioned distinctive selective use of the plural number of positioning sections 2 through 4, the positioning sections 2 through 4 are moved by the movement means to automatically position any one corresponding to the type of the board in the common specified position for positioning the board. Thus the board 1 of any type can be positioned in the specified position in a manner as described above, thereby saving manual works and allowing a further time saving by virtue of a speedy change.

The support member 5 and the movement means 21 for moving the support member 5 can be provided independently for each of the positioning sections 2 through 4. However, they are common in the present preferred embodiment to achieve simplified structure and operational control.

The support member 5 is a common rotary table for supporting the positioning sections 2 through 4. By rotating the rotary table 5, a required positioning section, e.g., only the positioning section 2 in FIGS. 1 through 4 is positioned in the specified position for positioning the board 1.

With the above-mentioned arrangement, the required one of the plural number of positioning sections 2 through 4 is surely moved to the specified position to selectively use the one in the simple manner of moving the rotary table 5. When there are not many positioning sections, as in the positioning sections 2 through 4 of the present preferred embodiment, the required number of positioning sections 2 through 4 can be arranged in a relatively compact style as shown in FIGS. 1 through 4.

As shown in FIGS. 1 through 4, the rotary table 5 has a base plate 12 and a rotary shaft 22 which is rotatably supported by a support plate 152 mounted to left and right columns 151 on the base plate 12. An upper table 5a and a lower table 5b are integrally provided around the rotary shaft 22 above the base plate 12. The positioning sections 2 through 4 are supported by the upper table 5a, the lower table 5b, and a rotary shaft middle portion 22a which has a triangular sectional shape and is located between the tables 5a, 5b. By rotating the positioning sections 2 through 4 around the rotary shaft 22, any one of the positioning sections 2 through 4 can be positioned in the specified position for positioning the board 1.

As shown in FIGS. 3 and 4, the movement means 21 is a unit having a motor 42 mounted to a support frame 41, a drive gear 43, a coupling gear 44 provided with a torque limiter 40 for connecting an output shaft of the motor 42 with the drive gear 43, and the torque limiter 40. The unit is mounted to a lower surface of the base plate 12 by means of the support frame 41. The drive gear 43 of the movement means 21 is provided above the base plate 12 and is meshed with a driven gear 45 mounted around the rotary shaft 22. Upon receiving a rotatory force from the motor 42, the drive gear 43 rotates the rotary table 5 by a required amount, thereby allowing any one of the positioning sections 2 through 4 to be positioned in the specified position for positioning the board 1.

The positioning sections 2 through 4 are provided with a first positioning means 25 for positioning the board 1 in a direction of the plane of the board 1 by inserting positioning pins 24 into position regulating holes 23 of the board 1, and a second positioning means 28 constituted by combining a frame member 26 which receives an upper surface of the board 1 on the periphery of the surface to be processed in a position at a reference height with pressure members 27 which press the board 1 against the frame member 26 to determine a position in height of the upper surface of the board 1.

With the above-mentioned arrangement, positioning the board 1 in the specified position by selectively using the positioning sections 2 through 4, as shown by an imaginary line in FIG. 4, the board 1 is positioned in the direction of the plane of the board 1 by engaging the positioning pins 24 of the first positioning means 25 with the position regulating holes 23 of the board 1, thereby allowing the board 1 to receive a variety of works in a proper position from the work head C in the present preferred embodiment. Concurrently with the above-mentioned operation, the upper surface of the board 1 is correctly positioned in a position in height corresponding to the reference height defined by the frame member 26 by means of the frame member 26 of the second positioning means 28 and the pressure members 27 which press the upper surface of the board 1 against the frame member 26 without being influenced by a change in thickness of the board 1. Thus, the various works on the upper surface of the board 1 can be made to be performed uniformly and correctly through a window portion 26a of the frame member 26 without any adjustment in response to a change in thickness of the board 1. For instance, the above-mentioned arrangement obviates the need for adjustment of a laser light collecting position for performing the aforementioned trimming process and a focus control in visually recognizing the electronic components for the process.

The frame members 26 of the positioning sections 2 through 4 are mounted on the upper table 5a circumferentially at regular intervals, and the positioning pins 24 and the pressure members 27 of the positioning sections 2 through 4 are mounted on a first elevation support member 29 which is moved up and down just below the frame members 26 of the positioning sections 2 through 4. The pressure members 27 are provided erect as opposed to both side edges of the board 1, and the aforementioned measurement device 6 is provided between the pressure members 27. The measurement device 6 is implemented by a plurality of contact probe pins which are supported on a support plate 32 mounted by means of legs 31 to a second elevation support member 30 which is moved up and down just below the first elevation support member 29. The contact probe pins are allowed to vertically slide, and are normally placed in the uppermost movement end positions by urging forces exerted from urging means such as springs.

The second elevation support member 30 is supported so that the second elevation support member 30 can be moved up and down along a guide 231 provided on each flat surface 22b of the rotary shaft middle portion 22a and a guide 232 provided on the lower table 5b, while a rivet-shaped connection pin 33 is provided on a lower surface of a portion of the second elevation support member 30. In the specified position for positioning the board 1 is provided an elevation drive plate 35 which is connected to an elevation cylinder 34 mounted to a support frame 38 below the base plate 12 and protrudes above the base plate 12. When one of the positioning sections 2 through 4 reaches the specified position for positioning the board 1, the connection pin 33 of the second elevation support member 30 enters a C-shaped hook 35a provided at an upper end portion of the elevation drive plate 35 to be engaged with each other.

With the above-mentioned operation, the second elevation support member 30 associated with one of the positioning sections 2 through 4 receives an elevating force exerted by the elevation drive plate 35 which is driven by the elevation cylinder 34.

The first elevation support member 29 is supported so that it can be moved up and down along the guide 231 provided on each flat surface 22b of the rotary shaft middle portion 22a and the legs 31 of the second elevation support member 30. A spring 36 mounted around the guide 232 on the lower table 5b between the first elevation support member 29 and the second elevation support member 30 is operated to always put the first elevation support member 29 in the uppermost movement position above the second elevation support member 30.

When the second elevation support member 30 engaged with the elevation drive plate 35 is moved up in the specified position, the first elevation support member 29 is concurrently moved up by the operation of the spring 36. Then, the positioning pins 24 are inserted from below into the position regulating holes 23 of the board 1 which has been transferred to the specified position along guide rails 37 by the transfer means A, thus performing the positioning by the first positioning means 25. In this positioning condition, the board 1 is lifted up from the guide rails 37 of the transfer means A by means of the pressure members 27 and then pressed against the frame member 26, thus performing the positioning by the second positioning means 28.

In the above position, the first elevation support member 29 is prevented from further moving up, and thereafter only the second elevation support member 30 is moved up until the second stops in the specified position with the contact probe pins 6 abutting against the board 1 which has been positioned. The stop condition continues while one or an appropriate number of electronic components on the positioned board 1 undergo a required laser processing. Thereare performed supply of electricity for putting into an operating condition to a required degree the electronic components or an electronic circuit utilizing the electronic components to be processed via the contact probe pins 6, and monitoring of the characteristics of the electronic components to be processed by an output. Then the trimming is performed so that the monitored values become predetermined values.

When the laser processing of the positioned board 1 is completed, the second elevation support member 30 is moved down by the elevation cylinder 34, and the contact probe pins 6 and the first and second positioning means 25 and 28 are moved back to the normal positions as indicated by solid lines in FIG. 4.

The positioning sections 2 through 4 are each further provided with a connector 47 for the supply of electricity and the outputting of signals. On the other hand, there is provided in a portion on the base plate 12 an external connector 48 in a position opposite to the connector 47 corresponding to the positioning section located in the position for positioning the board 1, e.g., the positioning section 2 in FIGS. 1 through 4. The external connector 48 is connected to a piston cylinder 49 mounted on the base plate 12. By advancing and retreating the external connector 48 with respect to the connector 47 of the aforementioned positioning section by the piston cylinder 49, the external connector 48 can be connected to or disconnected from the connector 47.

By connecting the connectors 47, 48 while the laser processing is effected, the supply of electricity and outputting of the signals can be externally performed. Furthermore, by disconnecting the connectors 47, 48 while the laser processing is not effected, the positioning sections 2 through 4 can be moved for the selective use.

Furthermore, as shown in FIG. 3, a position detecting dog 51 is mounted around a lower end portion of the rotary shaft 22. Around the rotary shaft 22 on the base plate 12 is provided an appropriate number of sensors 52 which detect the position of the detecting dog 51 to decide that one of the positioning sections 2 through 4 has reached the specified position for positioning the board 1 and determine which of the positioning sections 2 through 4 has reached the specified position.

With the above-mentioned arrangement, the operation of moving any one of the positioning sections 2 through 4 to the specified position and selectively using the same is automatically performed.

Figure 5A:
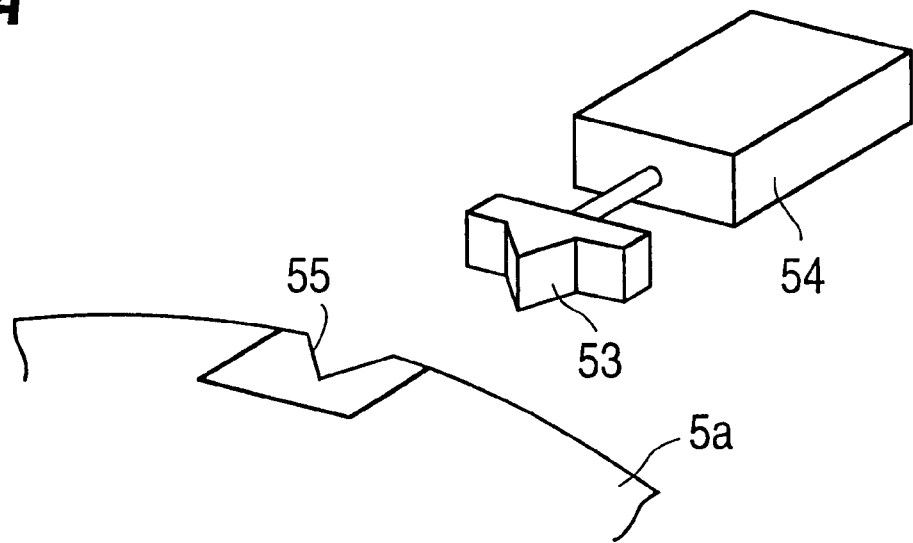
FIGS. 5A and 5B are perspective views showing maintenance conditions of the board positioning mechanism section of-the apparatus shown in FIG. 1.

Furthermore, in order to correctly position each of the positioning sections 2 through 4 into the specified position, a triangular shaped positioning stopper 53, as shown in FIG. 5A, is provided opposite to the circumference of the upper table 5a, The stopper 53 is connected to a piston cylinder 54 fixed to a portion of the main body frame 11. The piston cylinder 54 advances the stopper 53 when a required one of the positioning sections 2 through 4 is transferred to the specified position and then the stopper 53 is engaged with a V-shaped notch 55 provided in the circumference of the upper table 5a, thereby retaining the required positioning section in the correct engagement position. The torque limiter 40 prevents an excessive load from being exerted on the driving side even when the above-mentioned engagement operation is performed while the positioning sections 2 through 4 are being rotated. Therefore, after the positioning is completed, the rotatory driving of the positioning sections 2 through 4 can be stopped, thereby allowing the positioning to be correctly effected. The torque limiter 40 is also effective in ensuring safety when the rotatory driving of the positioning sections 2 through 4 is overloaded for some reason.

Figure 5B:
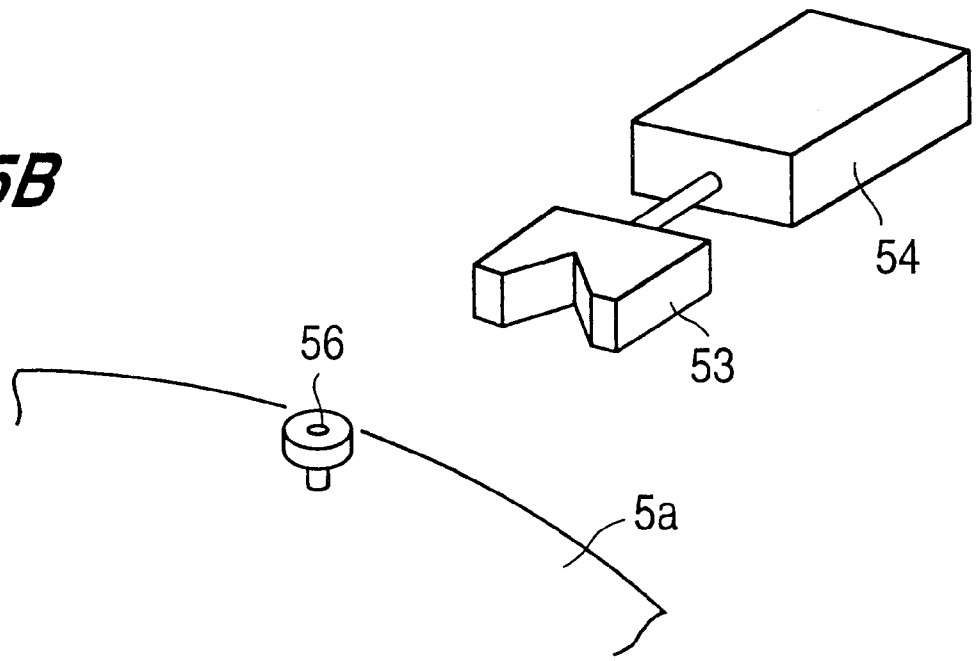

FIG. 5B shows a modification designed to achieve the aforementioned positioning by means of a V-shaped stopper 53 by engaging the stopper 53 with a cam follower 56 provided at a peripheral portion of the upper table 5a.

Figure 6:
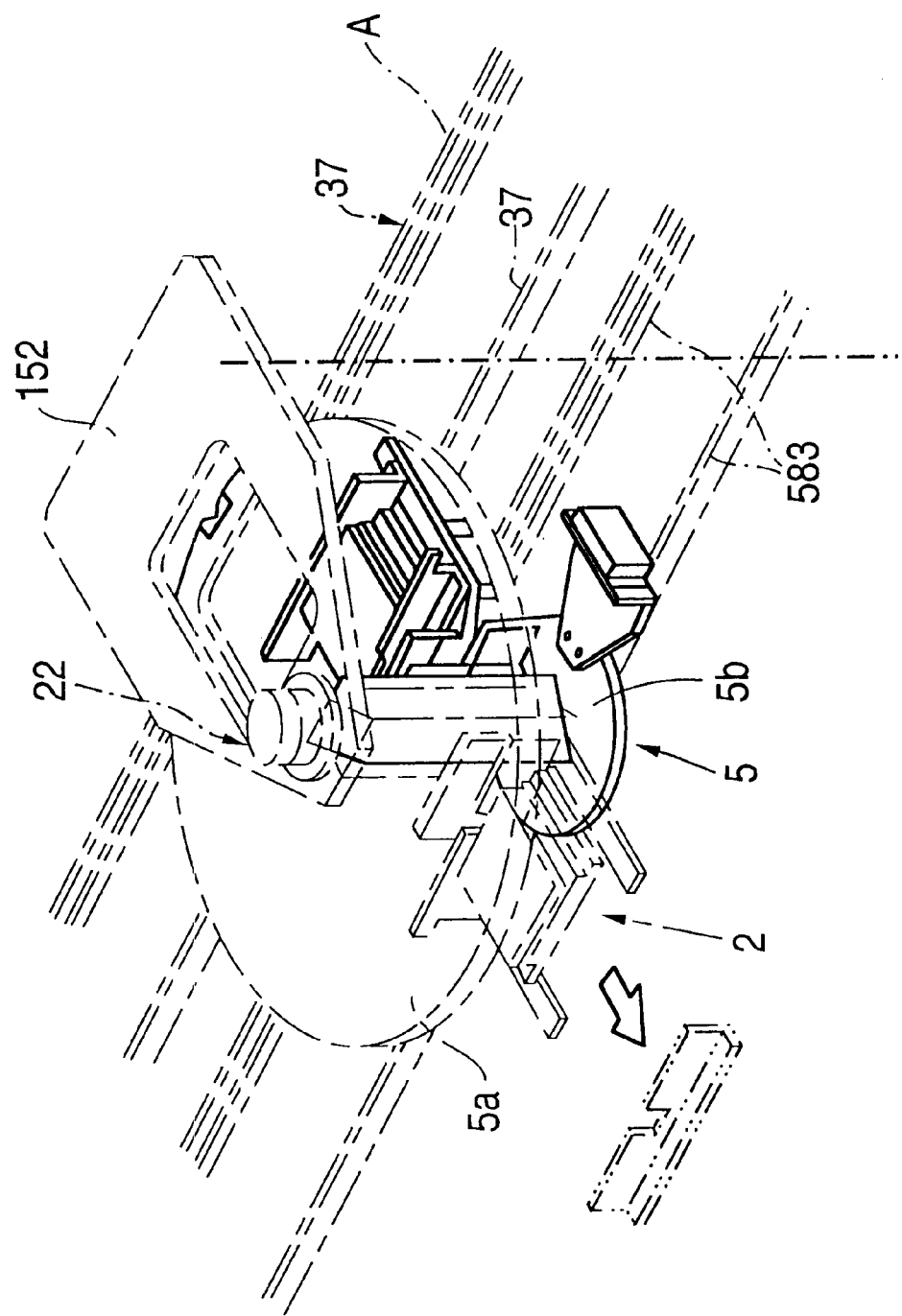
FIG. 6 is a perspective view showing a rotary table positioning mechanism of the apparatus shown in FIG. 1 and a modification of the mechanism.

FIG. 6 shows a maintenance condition of the positioning sections 2 through 4. The positioning sections 2 through 4 are selectively used by being moved one by one to the specified position for positioning the board 1. FIG. 6 shows a case where any of the positioning sections 2 through 4, e.g., the positioning section 2 in FIGS. 1, 2, and 6 is subjected to the maintenance. By placing the positioning section in a front portion of the apparatus, movement and replacement of the first and second positioning means 25 and 28, movement and replacement of the support pins, movement and replacement of the measurement device 6, and other required maintenance works can to be performed.

Figure 7A:
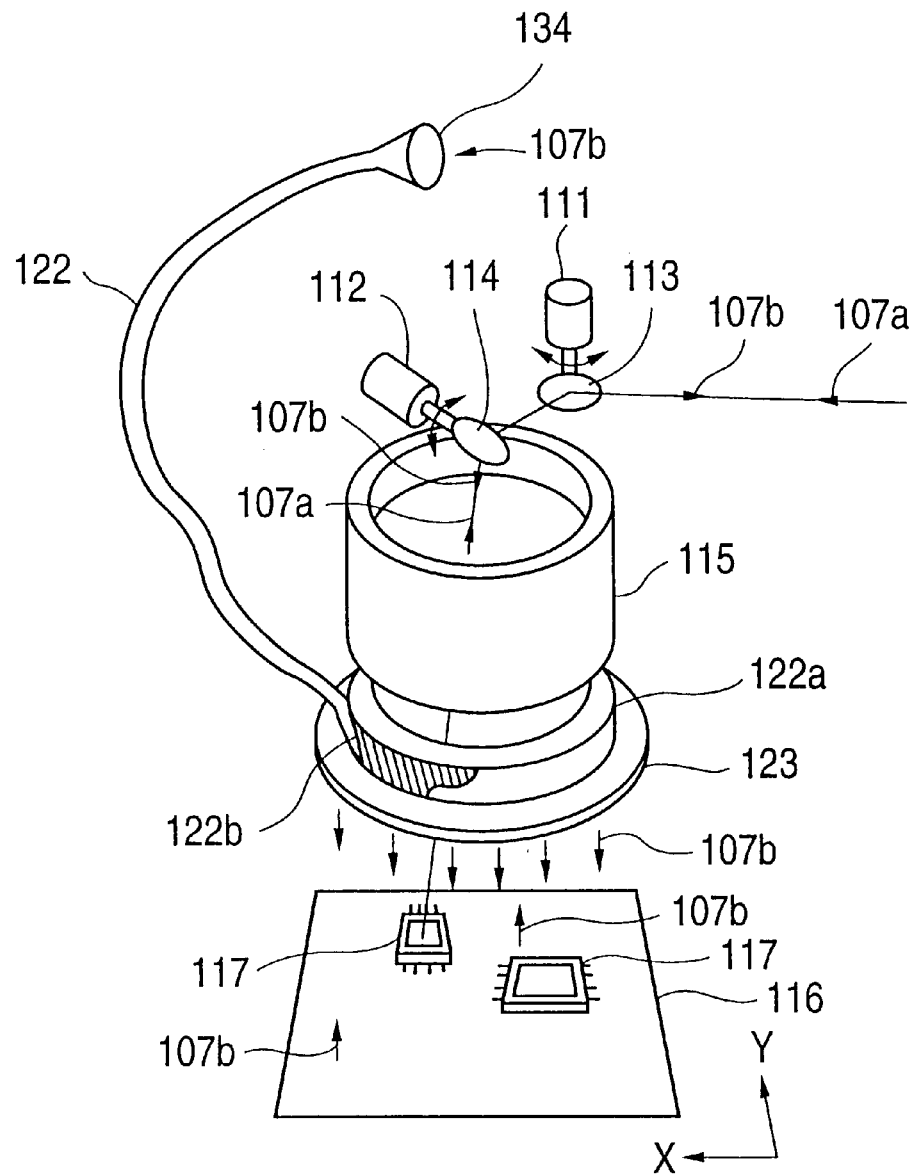
FIG. 7A is a perspective view showing a partial structure of a laser optical system provided for a working head of the apparatus shown in FIG. 1
Figure 7B:
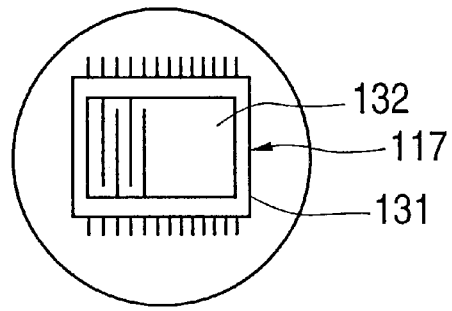
FIG. 7B is an enlarged view of an electronic component mounted on a board after "FIG. 1"
Figure 8:
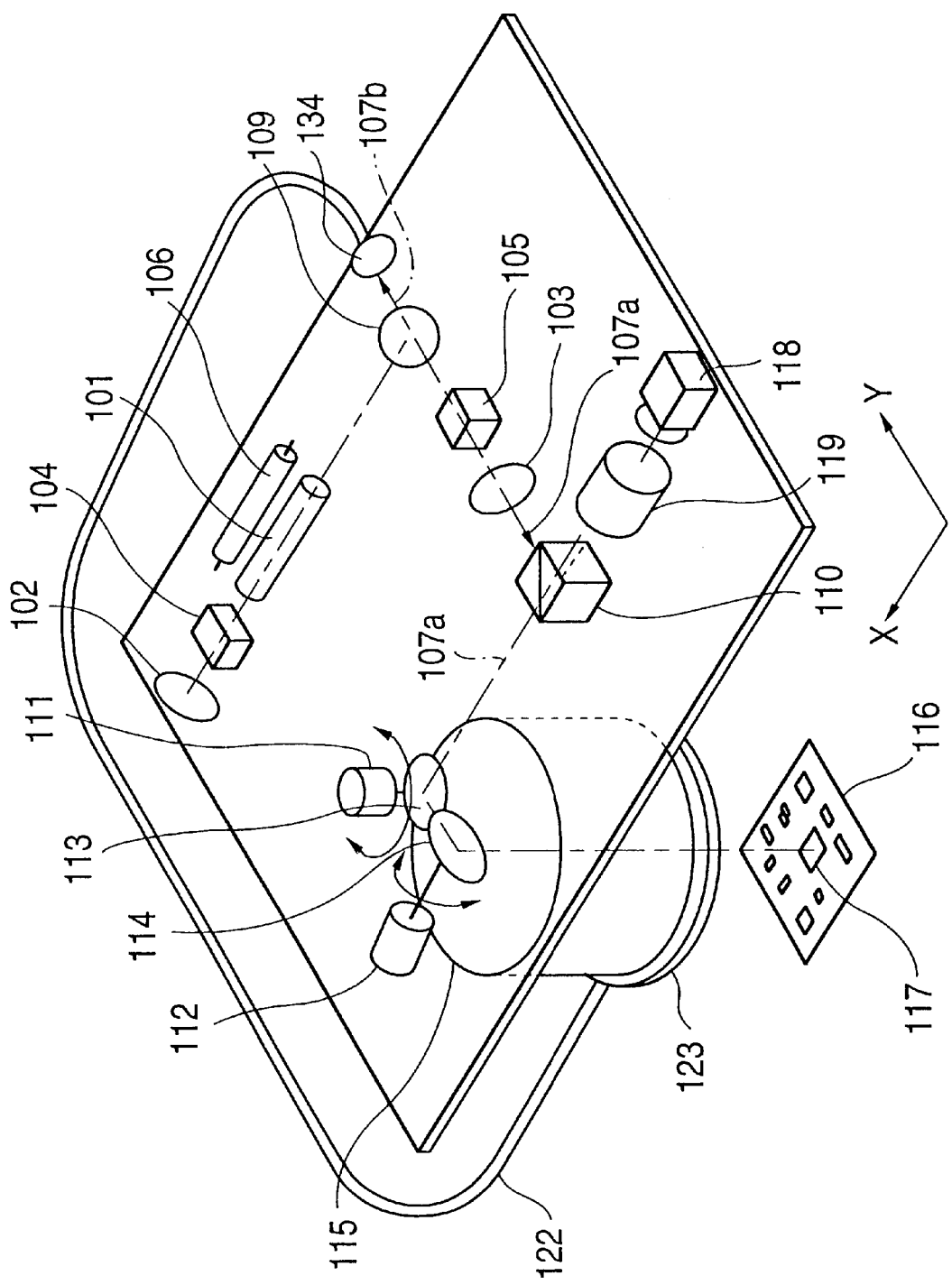
FIG. 8 is a perspective view showing a light source side optical system including an illumination optical system of the laser optical system shown in FIG. 7.

The work head C of the present preferred embodiment is provided with an optical system for laser processing as shown in FIGS. 7A-7B and 8. In FIG. 8, a laser output light (processing laser light) 107a emitted from a laser oscillator (not shown) is firstly incident on an X-scanner mirror 113. Since the X-scanner mirror 113 is reciprocatingly pivoting in the X-direction as indicated by an arrow by the operation of an X-galvano-scanner 111, the laser output light 107a incident on the X-scanner mirror 113 is scanned in the X-direction and reflected so as to change its travelling direction at an angle of 90° to be incident on a Y-scanner mirror 114. Since the Y-scanner mirror 114 is reciprocatingly pivoting in the Y-direction as indicated by an arrow by the operation of an Y-galvano-scanner 112, the laser output light 107a incident on the Y-scanner mirror 114 is scanned in the Y-direction and reflected so as to change its travelling direction at an angle of 90° to be incident on an fθ lens 115. The fθ lens 115 has an operation of focusing on a flat surface a light having a frequency of 532 nm of the laser output light 107a (the second higher harmonic of a YAG laser is used in a manner as described hereinafter) Therefore, the laser output light 107a is scanned as collected in a scanning position on a circuit board 116 mounted with electronic components 117 to be processed. Then, by performing the scanning in the X-direction and the Y-direction and oscillation control of the laser oscillator by oscillation control means (not shown), only the desired position is subjected to the laser processing.

For instance, a trimming process for adjusting a resistance, a reactance, and a capacitance is performed by laser processing effected on the board 1 mounted with a variety of components. For example, an electronic component 117 having a portion 132 to be trimmed is mounted inside a casing 131. After the mounting is completed, the portion 132 to be trimmed of the electronic component 117 is trimmed by the laser processing to adjust the inductance. The trimming is required to have a requirement position recognition accuracy of 10 μm in the processing stage, and a capability of processing a copper foil.

In order to achieve the requirement position recognition accuracy of 10 μm, the present preferred embodiment uses a single-frequency illumination laser light which produces no chromatic aberration in a manner as described hereinafter. In order to allow a copper foil to be processed, a laser light having a frequency of 532 nm within a range of 250 nm to 600 nm in which a small reflectivity is assured with respect to copper is used as the processing laser light.

For the above-mentioned purpose, it is required to eliminate the spatial coherence of the laser light to prevent an interference fringes from appearing in the illumination. Therefore, firstly, a laser output light (illumination laser light) 107b having the same frequency as that of the laser output light 107a is made to enter an optical fiber bundle 122 is arranged in a form of an optical fiber ring 122a, and terminal ends of a plurality of optical fibers 122b constituting the optical fiber bundle 122 are arranged approximately uniformly on a lower surface of the optical fiber ring 122a. Then the laser output light 107b outputted from the terminal ends of the optical fibers 122b is further irradiated onto the board 1 through a light scattering plate 123 for refracting at random transmission light. In the course of the above-mentioned operation, the laser output light 107b gradually looses its spatial coherence through multiple reflection while being transmitted through the optical fiber bundle 122. Since the laser output light 107b further passes through the light scattering plate 123, the light losses its spatial coherence. Therefore, the light can be used as an illumination light even through the laser output light 107a is a linearly polarized laser light.

The fθ lens 115 focuses light having the frequency of the laser output light 107b on a flat surface. Therefore, the aforementioned laser output light 107b which has completely lost its spatial coherence illuminates the board 1.

As shown in FIG. 8, the laser oscillator is comprised of: an Nd:YAG rod 101; a rear mirror 102 which is arranged at an end of the Nd:YAG rod 101 and operates to totally reflect light having a frequency of 1064 nm; a mirror 109 which is a dichroic mirror arranged at the other end of the Nd:YAG rod 101 and operates to totally reflect light having a frequency of 1064 nm and transmit light having a frequency of 532 nm; an output mirror 103 which is arranged in a direction of reflection of the mirror 109 and operates to totally reflect light having a frequency of 1064 nm and transmit light having a frequency of 532 nm; an acoustooptic Q-switch element 104 which is arranged between the Nd:YAG rod 101 and the rear mirror 102 and operates to oscillate a laser as a pulse having a frequency of 1 kHz to 5 kHz; a frequency converter element 105 which is arranged between the mirror 109 and the output mirror 103 and is implemented by a nonlinear optical crystal for converting the laser having a frequency of 1064 nm into a second higher harmonic laser having a frequency of 532 nm; and a pumping lamp 106.

When the Nd:YAG rod 101 is pumped by the pumping lamp 106, and the acoustooptic Q-switch element 104 is operated, linearly polarized laser output light 107a and laser output light 107b comprised of trains of pulses which has a pulse frequency of 1 kHz to 5 kHz, a pulse width of about 100 to 200 ns and a power of about 1 W per pulse are simultaneously outputted from the output mirror 103 and the mirror 109. The laser output light 107a outputted from the output mirror 103 is incident on a cubic polarizer 110. The cubic polarizer 110 totally reflects the linearly polarized laser output light 107a incident thereon. The totally reflected laser output light 107a is the laser output light 107a shown in FIG. 6.

The laser output light 107b outputted from the mirror 109 is the laser output light 107b shown in FIG. 7, and the laser output light 107b is collected by the lens 134 to enter the optical fiber bundle 122.

The laser output light 107b which has entered the optical fiber bundle 122 illuminates the board 1 in a manner as described with reference to FIG. 7. Then, the illumination laser light 107b reflected on the board 1 is focused through the fθ lens 115, the Y-scanner mirror 114, and the X-scanner mirror 113. The cubic polarizer 110 transmits the illumination laser light 107b which has lost its liner polarization characteristic, and therefore the above-mentioned focused image can be recognized by a recognition camera 118 through the cubic polarizer 110 via a focusing lens 119.

With the above-mentioned arrangement, since each of the laser output light 107a and the laser output light 107b to be used has a frequency of 532 nm, the fθ lens 115 is allowed to focus only single frequency. The above-mentioned arrangement allows the use of a reduced number of lenses, a simplified coating for preventing reflection, and cost reduction. Furthermore, since the light is a visible light, safety can be assured, and general optical products can be used as the recognition camera 118 and the like. Such optical products are inexpensive, and have high sensitivities. Furthermore, since there is no chromatic aberration, an increased recognition accuracy is achieved, thereby assuring the aforementioned-requirement recognition accuracy of 10 μm in a peripheral portion of an image having an area of 130 mm×130 mm.

Furthermore, the laser output light 107a of the processing laser light has a frequency of 532 nm within the frequency range of 250 nm to 600 nm in which a small reflectivity is assured with respect to a conductive material such as copper, and therefore copper foil and the like can be processed.

Figure 9:
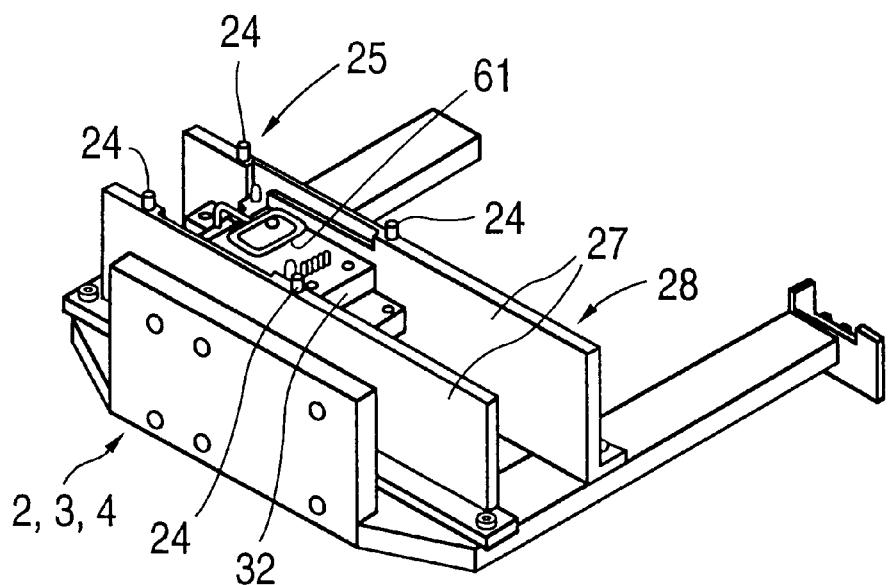
FIG. 9 is a perspective view showing another preferred embodiment of the positioning section.

FIG. 9 shows another preferred embodiment which also has the structure achieved by the combination of the first and second positioning means 25 and 28 in the positioning sections 2 through 4. However, a non-contact sensor 61 such as an antenna is provided as a measurement device on the support plate 32. With the above-mentioned arrangement, when an electronic component to be processed mounted on the board generates a characteristic signal such as a high frequency capable of being detected by the non-contact sensor 61, the aforementioned characteristic value can be monitored in a non-contact manner.

Figure 10:
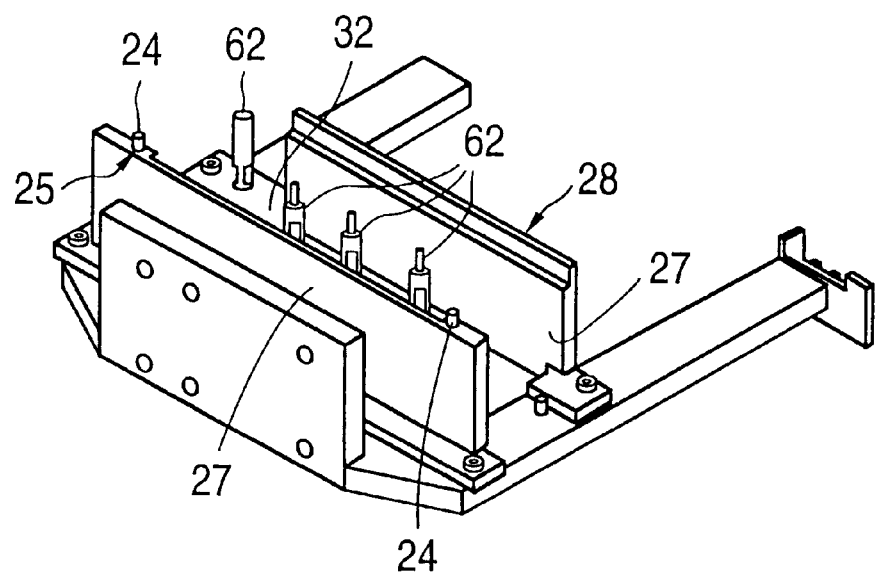
FIG. 10 is a perspective view showing another preferred embodiment of the positioning section.

FIG. 10 shows yet another preferred embodiment which also has the structure achieved by the combination of the first and second positioning means 25 and 28 in the positioning sections 2 through 4. However, there are provided support pins 62 for supporting the board 1 positioned on the support plate 32 to cope with a case where no measurement is performed. When the contact probe pins 6 which serve as a contact type measurement device as shown in the preferred embodiment in FIG. 1 are used, the contact probe pins 6 can be concurrently used as a support by being pressed against the rear surface of the board, thereby allowing the support structure to be eliminated. However, there are no contact probe pins 6 when no measurement is performed, and therefore the support pins 62 are necessary.

In order to support the board, there may be a support having another style. When the measurement is performed, it is preferred to adopt the support structure when the aforementioned non-contact measurement device is used. When a contact type measurement device is used, the support structure can be adopted as needed.

By thus providing the support pins 62 and a contact type measurement device together with the first and second positioning means 25 and 28 in the positioning sections 2 through 4, the support of a board in a position and a condition corresponding to the type of the board and the measurement by means of a contact type measurement device can be immediately achieved without any special work by means of the support pins and the measurement device preparatorily provided in correspondence with the type of the positioning sections 2 through 4 to be used by selectively using the positioning sections 2 through 4 corresponding to the type of the board.

Figure 11:
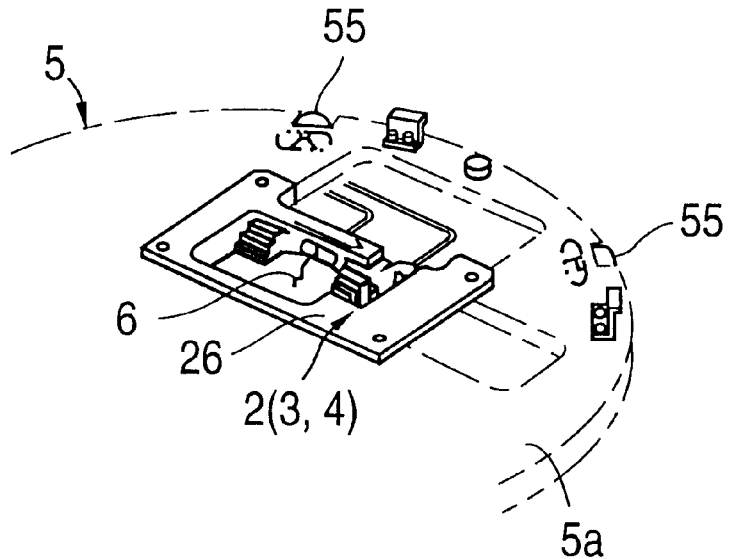
FIG. 11 is a perspective view showing another preferred embodiment of the positioning section.
Figure 12:
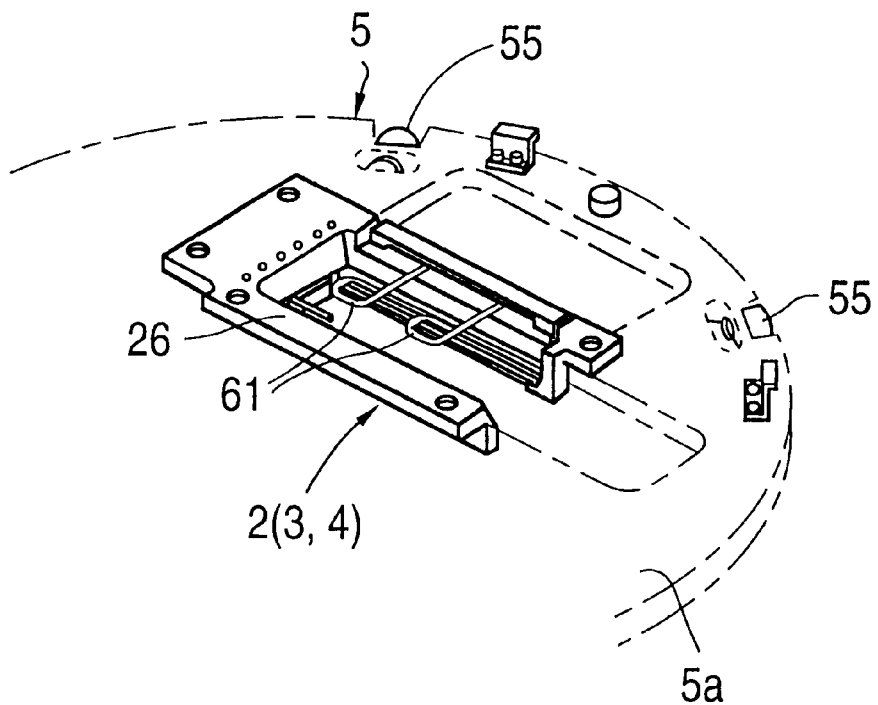
FIG. 12 is a perspective view showing another preferred embodiment of the positioning section.

FIGS. 11 and 12 show different preferred embodiments. In the preferred embodiment shown in FIG. 11, a probe pin 6 is provided at each of the frame members 26 of the positioning sections 2 through 4. By making the probe pin 6 abut against a specified position on the board which is positioned by being pressed from below against the frame member 26, the characteristic of the electronic component can be monitored. In the preferred embodiment shown in FIG. 12, a non-contact sensor 61 such as an antenna is provided at each of the frame members 26 of the positioning sections 2 through 4. Then a characteristic signal generated from each electronic component on the board which is positioned by being pressed against the frame member 26 can be monitored in a non-contact manner. In these cases, the change of the board can be achieved without the necessity of any special operation by selectively using the positioning sections 2 through 4. In these cases, since there is no function of supporting the board, it is preferable to provide the positioning sections 2 through 4 with support means.

Figure 13:
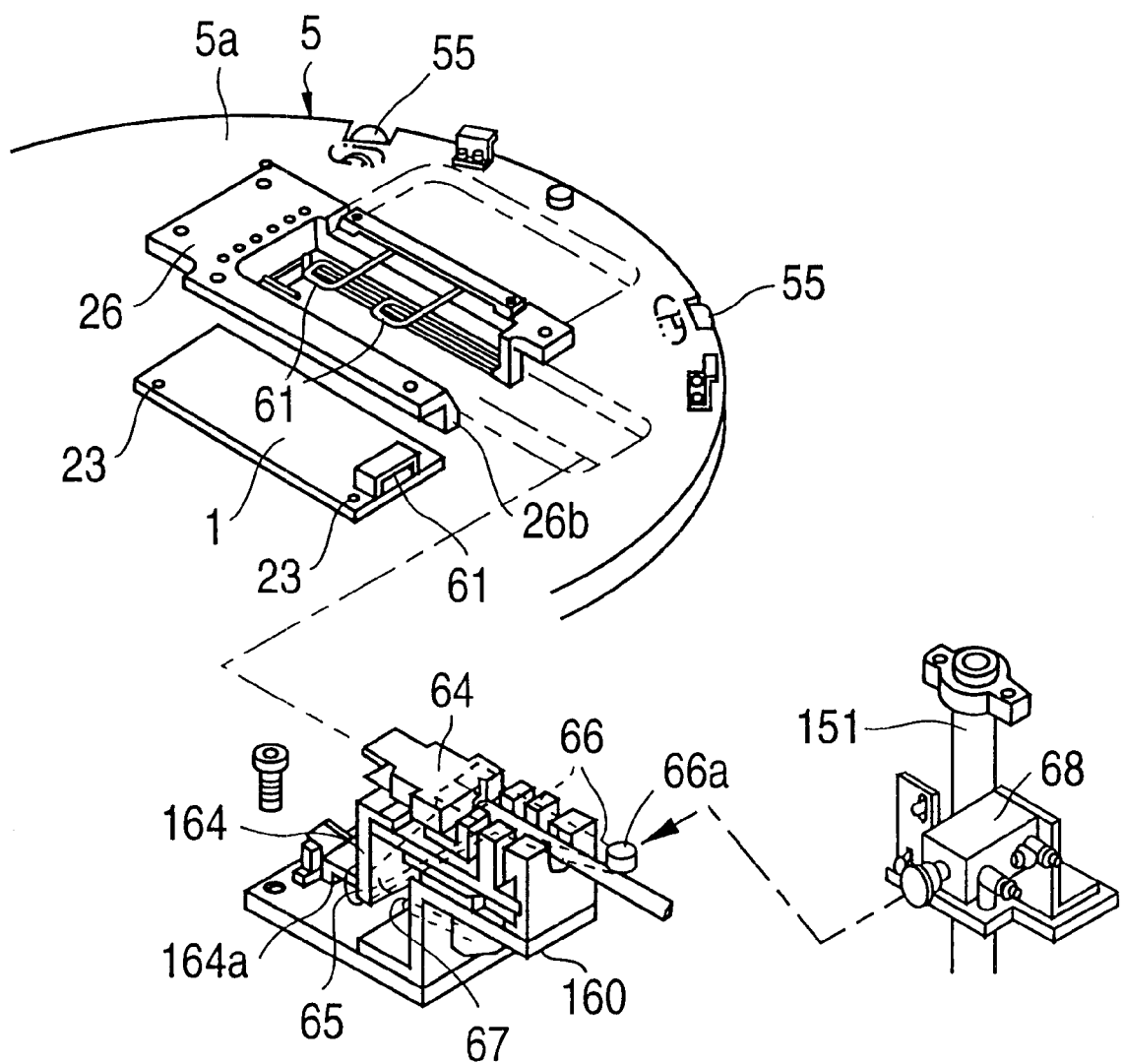
FIG. 13 is an exploded perspective view showing a preferred embodiment in which a frame member for positioning an upper surface of a board in the positioning section is provided with a connector for connection with the board.

FIGS. 13 and 14 show structures capable of monitoring the characteristic of the electronic component taking advantage of a connector 63 provided on an upper surface of the board 1. There is provided in a side portion 26b to be screwed of the frame member 26 as shown in FIG. 12 a connector 64 opposite to the aforementioned connector 63 of the board 1 which is positioned by being pressed against the frame member 26. The connector 64 is supported so that the connector 64 can advance and retreat via a bracket 164 with respect to a support bracket 160 mounted onto the upper table 5a together with the frame member 26. With a groove 164a of the bracket 164 is engaged a cam follower 65 at an end of an operating lever 66, and the operating lever 66 is urged so that the connector 64 is always retained in the position for separating-the connector 64 from the connector 63 via the bracket 164 by means of a spring 67 which is operating between the operating lever 66 and the upper table 5a. A drive cylinder 68 corresponding to the other end 66a of the operating lever 66 is mounted to the column 151 on the upper table 5a. While the drive cylinder 68 is extending to press the other end 66a of the operating lever 66 against the spring 67, the connector 64 is made to advance via the bracket 164 to connect the connector 64 to the connector 63 on the board 1, thereby allowing the monitoring to be achieved.

Figure 14A:
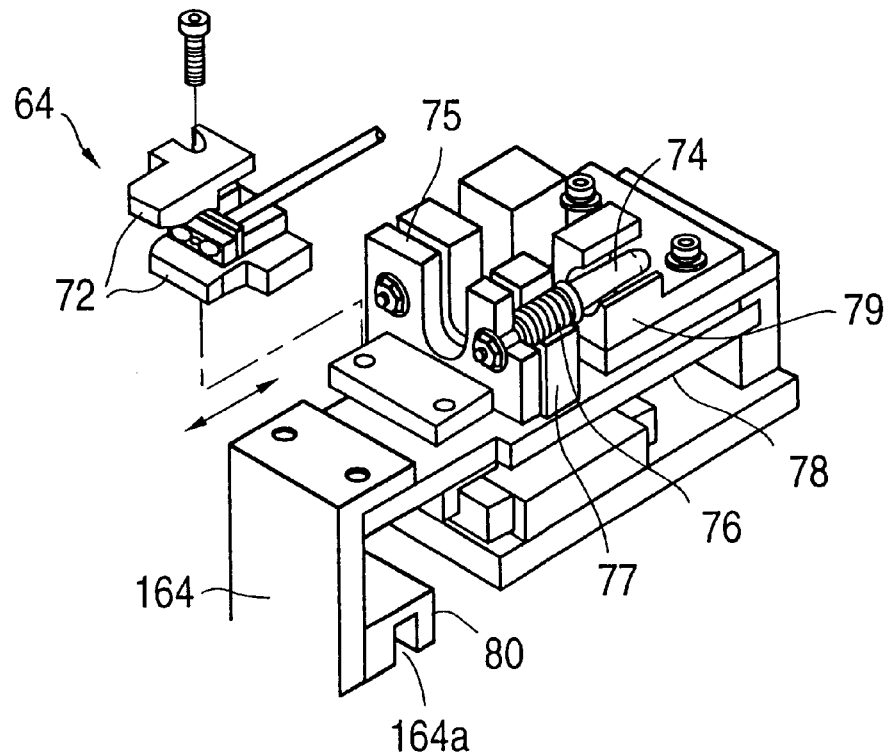
FIGS. 14A and 14B are a perspective view and a sectional view of the connector shown in FIG. 13.
Figure 14B:
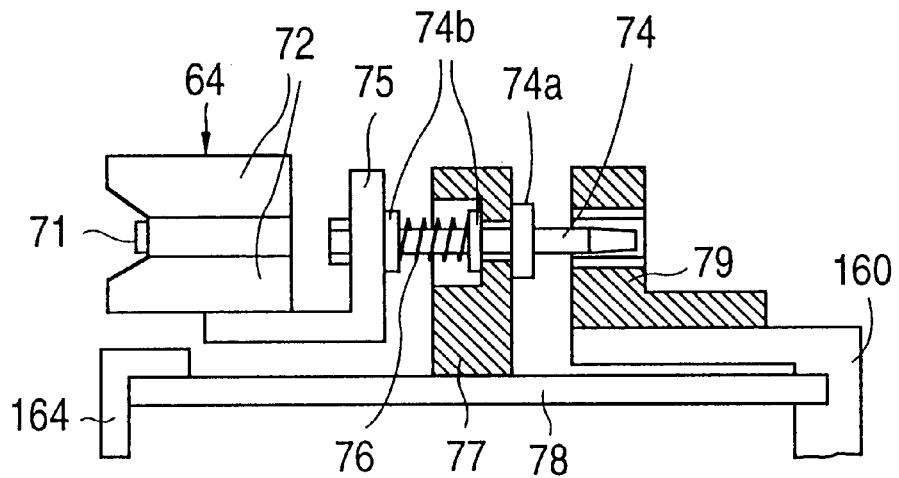

As shown in detail in FIGS. 14A and 14B, the connector 64 is comprised of a connector terminal 71 and a guide 72, and is mounted to a bracket 75. To the bracket 75 is fixed a pin 74, and the pin 74 penetrates a support block 77 owned by a slide plate section 78 of the bracket 164 with a play. The connector 64 is always retained in the most advanced position to a position where a flange 74a provided in a middle portion of the pin 74 abuts against a rear surface of the support block 77 in a manner as shown in FIG. 14B by an urging force exerted from a spring 76 which is operating via washers 74b between the bracket 75 and the support block 77. In the above place, by pinching the support block 77 with one washer 74b pressed against the support block 77 and the flange 74a, the pin 74 is stabilized-regardless of the play between the pin 74 and the support block 77.

The support bracket 160 supports the bracket 164 which is supporting the connector 64 with a play but in a stable condition by means of the support block 77 so that the bracket 164 can advance and retreat with the connector 64 by means of the slide plate section 78, and integrally supports a guide block 79 positioned behind the support block 77. The guide block 79 receives an end portion of the pin 74 deep enough to accept a tapered portion without a play in a normal condition as shown in FIGS. 14A and 14B to position the pin 74 in a specified reference position by effecting a compulsory position correcting function taking advantage of the play between the pin 74 and the support block 77, thereby retaining the connector 64 in a reference position where the connector 64 and the connector 63 are engaged with each other.

In contrast to the above, the connector 63 has at its tip end portion a guide portion (not shown) for receiving and guiding, with a play a tip end portion of the guide 72 owned by the connector 64 which is to be inserted for engagement, to a specified position for the engagement.

With the above-mentioned arrangement, when the connector 64 is made to advance via the bracket 164 by the operating lever 66 to be engaged with the connector 63, the pin 74 moves out of the guide block 79 and makes the engagement thereof with the guide block 79 come to have a play at the tapered portion. Subsequently, the play increases while the effective portion of the engagement of the pin 74 with the guide block 79 is shifting to a portion having a small diameter of the tapered portion. Eventually, when the pin 74 gets out of the guide block 79 to be released from the guiding of the guide block 79 and the pin 74 comes to have a play between the pin 74 and the guide block 79, the guide 72 of the connector 64 starts to be engaged with the connector 63 with a play. By taking advantage of the gradually increasing play between the pin 74 and the support block 77, the connector 63 further accepts the connector 64 while gradually reducing the play between the connector 63 and the guide 72, thereby guiding the connector 64 into the position where the connector 64 and the connector 63 are engaged with each other. At the time when the connector 64 starts to be engaged with the connector 63 in the specified position, the pin 74 is completely released from the guide block 79. The guiding function of the guide block 79 allows the connector 64 to be surely and correctly engaged with the connector 63 without disturbing the operation that the connector 63 receives the connector 64 by regulating in position the connector 64 to be engaged with each other.

When the operating lever 66 is put back to the original position, the pin 74 is inserted again into the guide block 79 to be positioned there.

Figure 15:
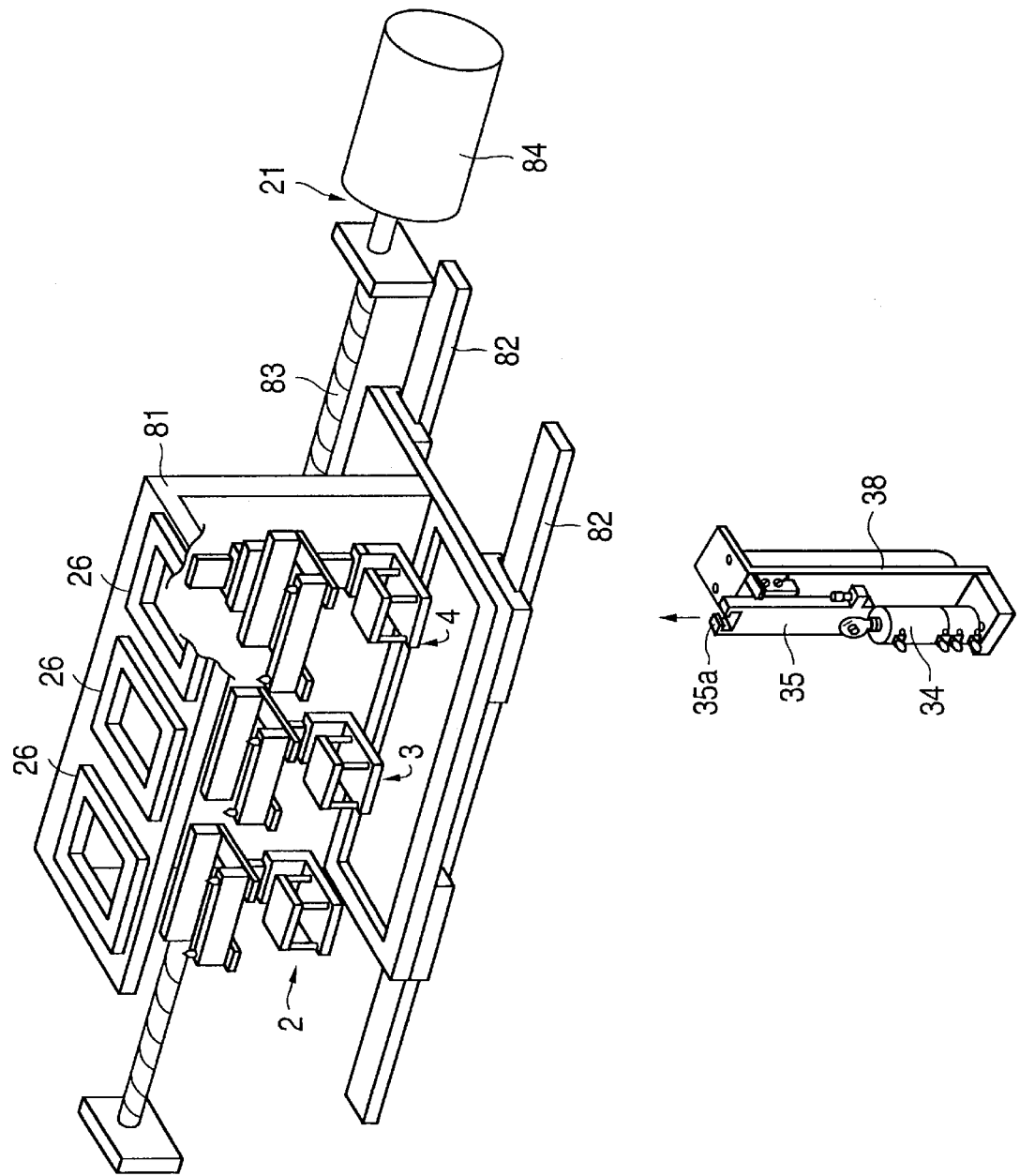
FIG. 15 is a perspective view showing a preferred embodiment in which the positioning section is moved by a slide table.

FIG. 15 is designed to retain the positioning sections 2 through 4 on a slide table 81, and position only the required one positioning section in the specified position for positioning the board 1 by reciprocating the slide table 81.

With the above-mentioned arrangement, in a simple manner of sliding the slide table 81, the required one of the plural number of positioning sections 2 through 4 can be surely moved to the specified position to be selectively used. Furthermore, even when there are many positioning sections, they can be arranged in a relatively compact style.

The slide table 81 is guided by two guide rails 82 so that the slide table 81 can reciprocate, while the movement means 21 reciprocates the slide table 81 by rotating forwardly or reversely a screw shaft 83 meshed with a gear provided on a rear surface of the slide table 81 by means of a reversible motor 84, thereby moving any one of the plural number of positioning sections 2 through 4 to the specified position and selectively using the same. It is to be noted that the reciprocating movement of the slide table 81 can be performed by a piston cylinder.

Below the specified position is provided an elevation mechanism by means of the elevation cylinder 34, thereby appropriately operating the positioning mechanism and the like provided at the positioning section move to the specified position in the same manner as in the first preferred embodiment.

Figure 16:
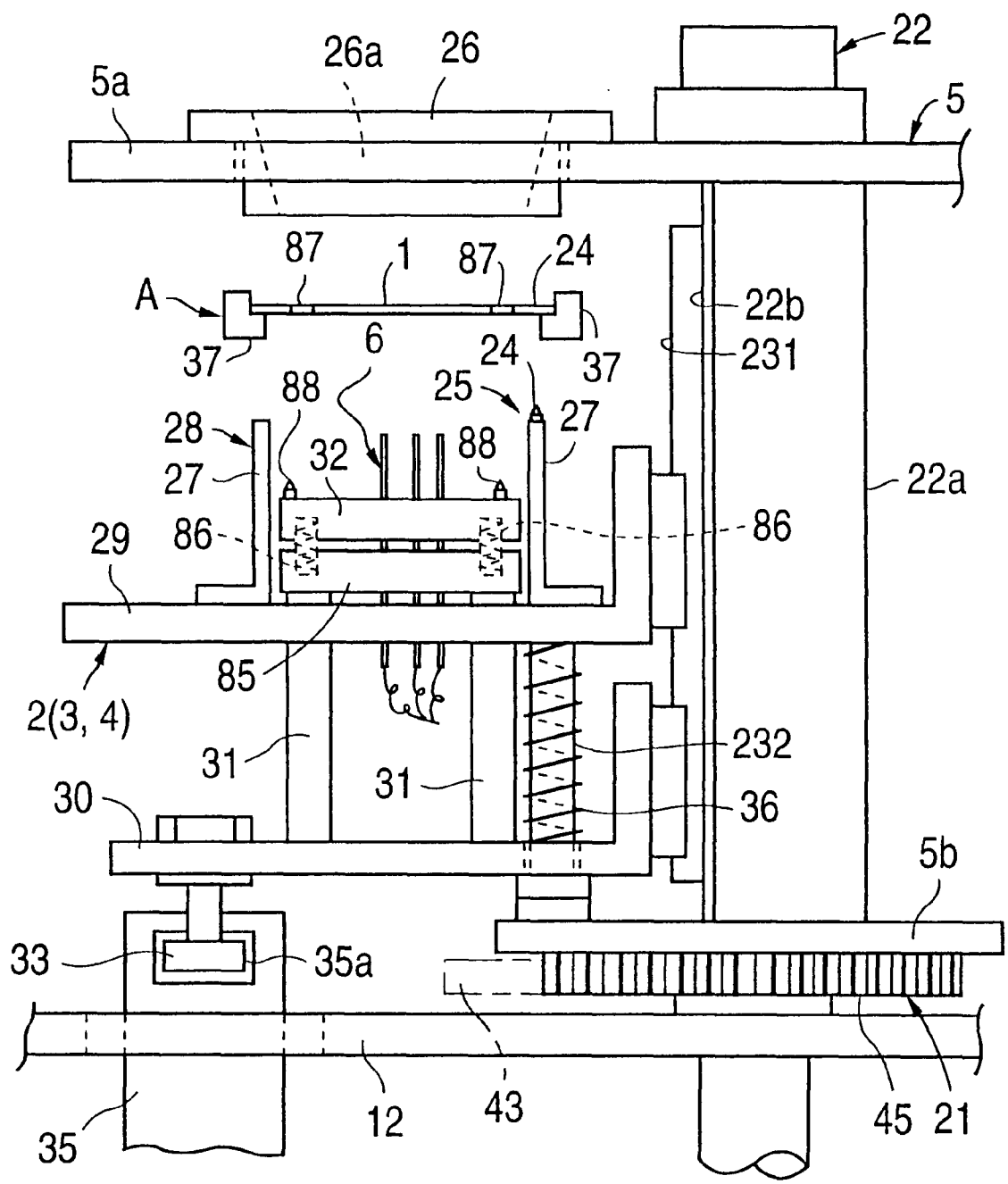
FIG. 16 is a side view showing a preferred embodiment in which a measurement device prepared at the positioning section is provided with a position regulating pin.

In an apparatus as shown in FIG. 16, the support plate 32 for supporting the contact probe pins 6 of the first preferred embodiment is supported via springs 86 on a base block 85 above the legs 31 in a floating manner. Meanwhile, position regulating pins 88 to be engaged with positioning holes 87 of the board 1 are provided on the support plate 32. By engaging the position regulating pins 88 with the positioning holes 87 of the board 1 in a final stage when the support plate 32 moves up and makes the contact probe pins 6 abut against the board 1 positioned in the specified position, the support plate 32 is regulated in position with respect to the positioned board 1. With the above-mentioned operation, possible failure in correctly positioning the contact probe pins 6 and the board 1 caused because it is depending only on the positioning achieved by the first and second positioning means 25 and 28 is avoided, thereby allowing the contact probe pins 6 to correctly abut against the specified position of the board 1.

Figure 17:
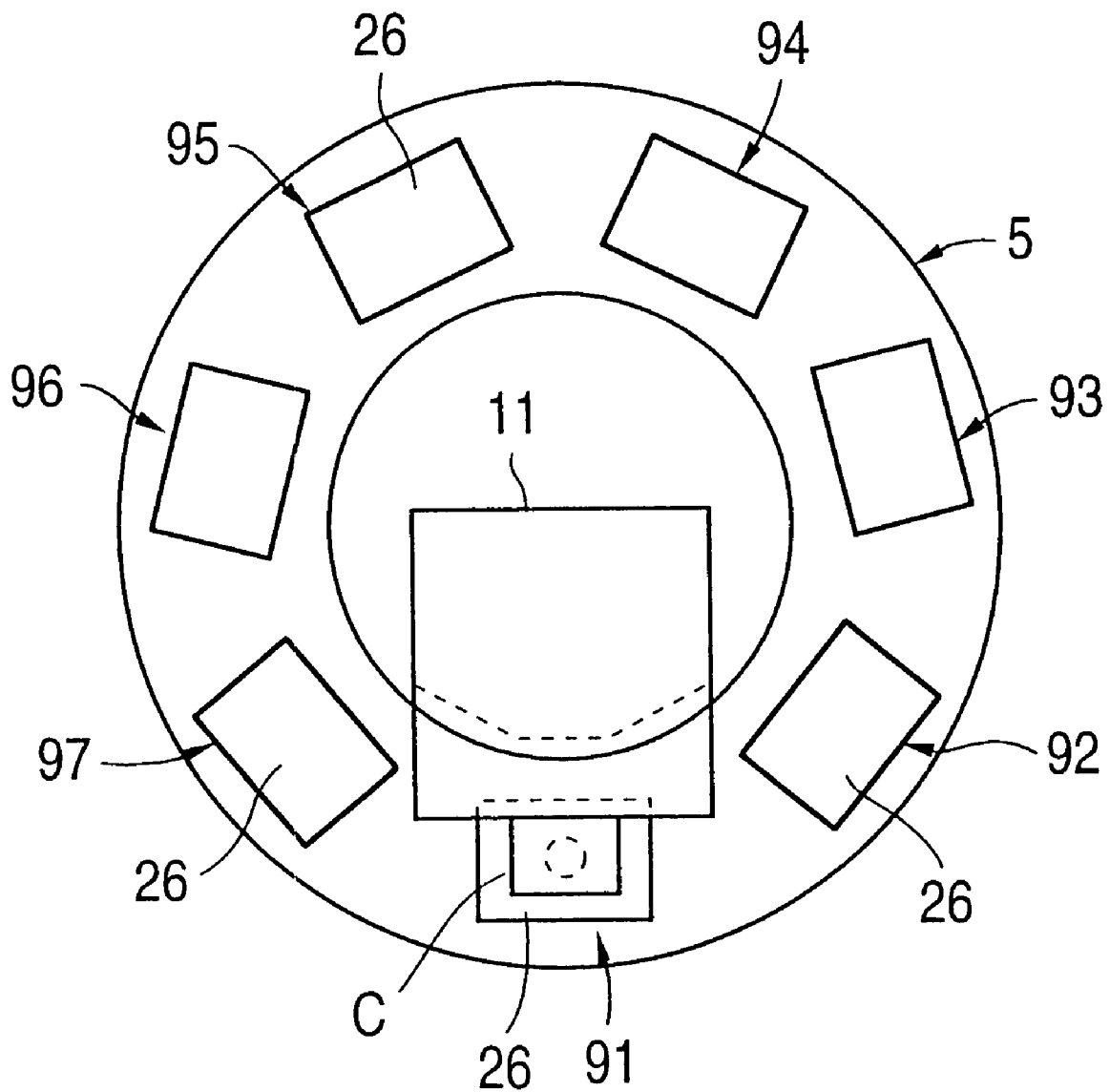
FIG. 17 is a plan view showing another preferred embodiment in which the positioning section is moved by a rotary table.
Figure 18:
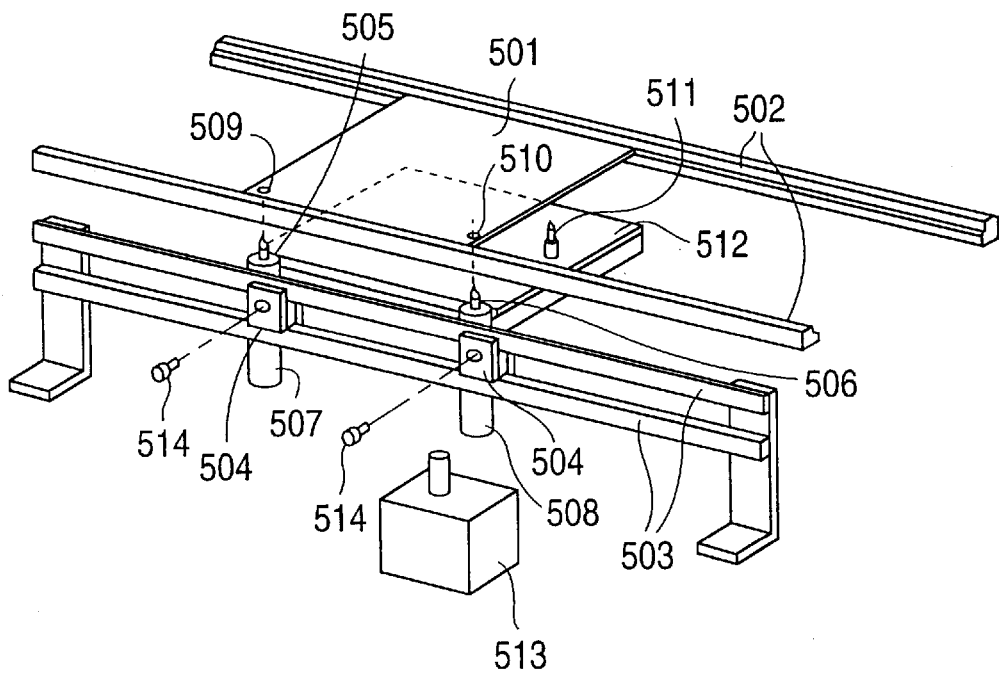
FIG. 18 is a perspective view showing a conventional positioning mechanism having support pins for a board.
Figure 19:
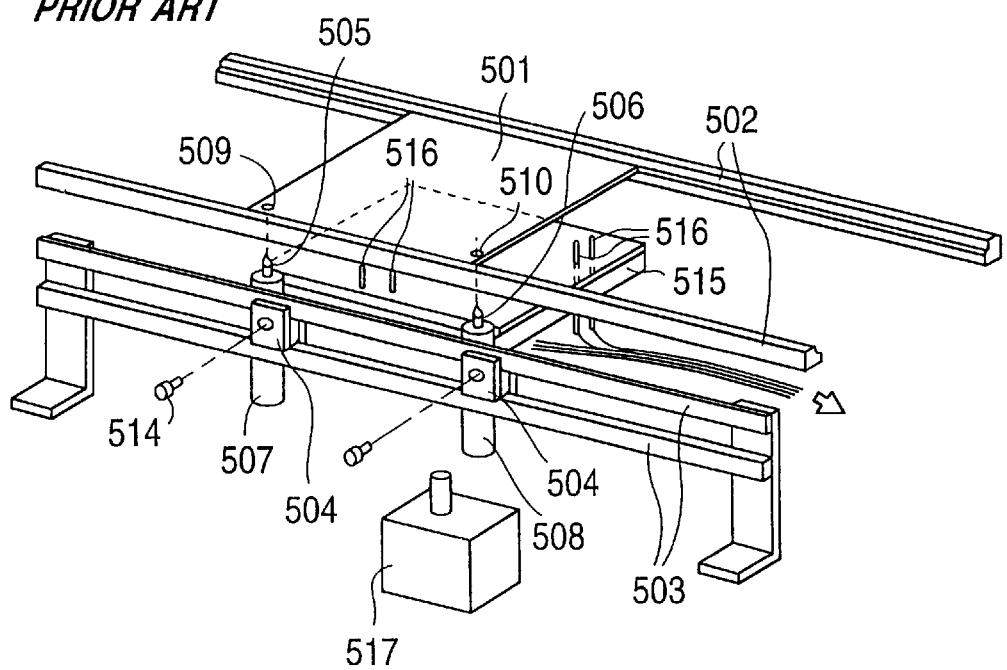
FIG. 19 is a perspective view showing a conventional positioning mechanism having contact probe pins for a board.

In an arrangement shown in FIG. 17, the rotary table 5 is made to have a circular form. By rotatively driving the rotary table 5 around the main body frame 11, any one of a plurality of positioning sections 91 through 97 held on the rotary table 5 can be selectively used by being moved to the specified position for positioning the board 1. With the above-mentioned arrangement, the plural number of positioning sections can be arranged compactly and used selectively. Furthermore, by performing maintenance of the positioning sections 91 through 97 when they are positioned on the side of the rear portion opposite from the fore portion where a variety of works are performed by the work head C, there are produced an effect that no influence is exerted on the works while utilizing the intervals between the works and an effect that the maintenance is not influenced by the works.

In the method and apparatus, when which of the positioning sections 2 through 3 is required, as shown in FIG. 2, it is preferable that the board 1 has an identifying code 1a such as bar codes and the code 1a is recognized by a reader 580 just before the positioning sections 2 through 4 and the required positioning section is decided based on the read data by the reader 580. According to this manner, the required positioning section can be automatically decided by the board 1 located just before the positioning sections 2 through 4. However, the required positioning section can be decided by an operator's observation of the board 1.

The various driving devices and other moving or driving members are controlled by a controller 600 in FIG. 2 to surely and suitably perform the above-described processes and operations.

In FIG. 2, reference numeral 582 denotes a device for selectively supplying the board 1 to the guide rails 37 and bypass guide rails 583. The device 582 includes a carrier 582a reciprocating along a rail 582b and rails 581 placed on the carrier 582a. The board 1 is firstly placed on the rails 581 of the carrier 582a and then is selectively supplied to either one of the guide rails 37 and the bypass guide rails 583 by the carrier 582a. That is, when two sets of the positioning apparatus are provided and the code 1a of the board 1 is read by the reader 580 and it decided that the board 1 should be received by the guide rails 37, the carrier 582a does not move from the position shown by solid lines in FIG. 2 to supply the board 1 to one of the positioning apparatus along the guide rails 37. When the code 1a of the board 1 is read by the reader 580 and it is decided that the board 1 should not be received by the guide rails 37 and should be transferred to another positioning apparatus via the bypass rails 583, the carrier 582a moves from the position shown by solid lines in FIG. 2 to another position to carry the board 1 and then supply the carried board 1 to the one of the positioning apparatus along the bypass guide rails 583 to perform a specified process and operation by the positioning apparatus.

According to the board positioning method and apparatus of the present invention, even when the type of the board is changed, the change can be managed while eliminating the complicated work for making the positioning structure of the positioning section itself cope with the change. Furthermore, even when the type of the board is changed, the change can be managed easily in a short time because the various types of the board can be positioned in the common specified position while not requiring the operator to mount, replace, or carry the positioning sections. Particularly in the case of an apparatus, the movement of one of the plural number of positioning sections into the specified position to use the same can be automatically surely achieved by the movement means, thereby allowing the work of change to be further simplified and allowing the working time to be further reduced.

According to the method in which each positioning section is preparatorily provided with a support member corresponding to the type of the board to be positioned by the positioning section and the board is supported by the support member in positioning the board, supporting of the board in the position and condition corresponding to the type of the board can be immediately achieved without any special work only by selectively using the positioning section corresponding to the type of the board. There is neither complicated work of change nor consumption of an excessive time in performing supporting of the board corresponding to the type of the board.

According to the board positioning method and apparatus of the present invention, by selectively using the positioning section corresponding to the type of the board, the measurement of the board performed by operating the measurement device on the positioned board can be immediately achieved without any special work. There is neither complicated work of change nor consumption of an excessive time in performing measurement corresponding to the type of the board.

According to the board positioning apparatus of the present invention in which the movement means has the common rotary table for supporting the positioning sections and only the required one of the positioning sections is positioned in the specified position for positioning the board by rotating the rotary table, the required one of the plural number of positioning sections can be surely moved to the specified position to be selectively used in a simple manner of rotating the rotary table. When there are not so many positioning sections, the required number of positioning sections can be arranged in a relatively compact style and moved for the selective use.

According to the apparatus in which the movement means has the common slide table for supporting each positioning section, and only the required one of the positioning sections is positioned in the specified position for positioning the board by reciprocating the slide table, the required one of the plural number of positioning sections can be surely-moved to the specified position to be selectively used in a simple manner of sliding the slide table. Even when there are many positioning sections, the positioning sections can be arranged in a relatively compact style.

Furthermore, there is provided the positioning apparatus of the present invention in which each positioning section is provided with the first positioning means for positioning the board in the direction of the plane of the board by making the position regulating hole engage with the positioning pin, and the second positioning means constituted by combining the frame member which receives the upper surface of the board in the position at the reference height on the periphery of the surface to be processed with the pressure member for positioning the position in height of the upper surface by pressing the board against the frame member. According to the above-mentioned apparatus, in positioning the board in the specified position, the board can be positioned in the direction of the plane of the board by the first positioning means to allow the board to receive a variety of external works in the proper position, and the upper surface of the board can be correctly positioned by the second positioning means without being influenced by the change in thickness of the board. Thus, the various works can be performed uniformly and correctly on the surface of the board to be processed without any adjustment corresponding to the change in thickness of the board.

According to the aforementioned construction of the board measurement apparatus of the present invention, concurrently with the selective use of each positioning section of each positioning apparatus in each of the aforementioned cases and the positioning and supporting of the board in correspondence with the type of the board, the required measurement can be performed immediately by means of the measurement section which is provided in the positioning section and used in positioning or further supporting the board without any special work.

Although the present invention has been fully described in connection with the preferred embodiments thereof with reference to the accompanying drawing, it is to be noted that various changes and modifications are apparent to those skilled in the art. Such changes and modifications are to be understood as included within the scope of the present invention as defined by the appended claims unless they depart therefrom.

What is claimed is:

1. A board positioning apparatus for positioning different types of boards, said board positioning apparatus comprising:

a plurality of board positioning stations located at a workstation, the board positioning stations being aligned in a plane;

a movable support member for supporting the plurality of board positioning stations;

a movement device for moving the movable support member in order to move the plurality of board positioning stations, said movement device being operable to select one of the plurality of board positioning stations in accordance with a particular type of board located in a specified position, and for moving the plurality of board positioning stations by operation of the support member until the selected positioning station is in a position aligned with the specified position of the board so that said selected positioning station confronts the board.

2. A board positioning apparatus as claimed in claim 1, further comprising a board measurement device for performing a board measuring operation at the selected positioning station, the measurement device being adapted for use with the type of board being positioned at the selected positioning station.

3. A board positioning apparatus as claimed in claim 1, further comprising a board elevating device for elevating the board into a predetermined position, the board elevating device including a support device provided at the selected positioning station and corresponding to the particular type of board being positioned.

4. A board positioning apparatus as claimed in claim 3, further comprising a board measurement device for performing a board measuring operation at the selected positioning station, the measurement device being adapted for use with the type of board being positioned at the selected positioning station.

5. A board positioning apparatus as claimed in claim 1, wherein the movable support member comprises a common rotary table for supporting the positioning stations, the rotary table being rotatable to position a selected one of the board positioning stations at the specified position of the board.

6. A board positioning apparatus as claimed in claim 1, wherein the movement device includes a common slide table for supporting each of the positioning stations, and only a required one of the positioning stations is put in a specified position for positioning the board by reciprocating the slide table.

7. A board positioning apparatus as claimed in claim 1, wherein each of the positioning stations is provided with a plurality of contact probe pins supported on a support member corresponding to the type of the board to be positioned.

8. A board positioning apparatus as claimed in claim 5, wherein each of the positioning stations is provided with a plurality of contact probe pins supported on a support member corresponding to the type of the board to be positioned.

9. A board positioning apparatus as claimed in claim 6, wherein each of the positioning stations is provided with a plurality of contact probe pins supported on a support member corresponding to the type of the board to be positioned.

10. A board positioning apparatus as claimed in claim 1, wherein each of the positioning stations includes:

a first positioning device for positioning the board in a direction of a plane of the board, the first positioning device including a positioning pin for being received in a position regulating hole of the board; and a second positioning device including a frame member for receiving an upper surface of the board at a reference height, and a pressure member for positioning the upper surface of the board by pressing the board against the frame.

11. A board positioning apparatus as claimed in claim 5, wherein each of the positioning stations includes:

a first positioning device for positioning the board in a direction of a plane of the board, the first positioning device including a positioning pin for being received in a position regulating hole of the board; and a second positioning device including a frame member for receiving an upper surface of the board at a reference height, and a pressure member for positioning the upper surface of the board by pressing the board against the frame.

12. A board positioning apparatus as claimed in claim 6, wherein each of the positioning stations includes:

a first positioning device for positioning the board in a direction of a plane of the board, the first positioning device including a positioning pin for being received in a position regulating hole of the board; and a second positioning device including a frame member for receiving an upper surface of the board at a reference height, and a pressure member for positioning the upper surface of the board by pressing the board against the frame.

13. A board positioning apparatus as claimed in claim 7, wherein each of the positioning stations includes:

a first positioning device for positioning the board in a direction of a plane of the board, the first positioning device including a positioning pin for being received in a position regulating hole of the board; and a second positioning device including a frame member for receiving an upper surface of the board at a reference height, and a pressure member for positioning the upper surface of the board by pressing the board against the frame.

14. A board positioning apparatus as claimed in claim 1, wherein each of the positioning stations includes a board measurement device corresponding to the type of the board to be positioned.

15. A board positioning apparatus as claimed in claim 5, wherein each of said positioning stations includes a board measurement device corresponding to the type of the board to be positioned.

16. A board positioning apparatus as claimed in claim 6, wherein each of said positioning stations includes a board measurement device corresponding to the type of the board to be positioned.

17. A board positioning apparatus as claimed in claim 7, wherein each of said positioning stations includes a board measurement device corresponding to the type of the board to be positioned.

18. A board positioning apparatus as claimed in claim 10, wherein each of said positioning stations includes a board measurement device corresponding to the type of the board to be positioned.

19. A board positioning apparatus comprising:

a rotary shaft;

a support structure mounted on said rotary shaft;

a plurality of positioning stations supported on said support structure for positioning a plurality of different kinds of boards in a plane; and a movement mechanism coupled with said rotary shaft for selectively rotating said supporting structure in order to align said positioning stations in a specified position at which the different kinds of boards are to be positioned, wherein said movement mechanism is adapted to selectively align said positioning stations at the specified position in accordance with the type of the board to be positioned.

20. A board positioning apparatus as claimed in claim 19, wherein each of said positioning stations is provided with a board measuring device for measuring the positioned board.

21. A board positioning apparatus as claimed in claim 20, wherein each of said board measuring devices comprises a support plate, a plurality of contact probe pins supported on said support plate, and an elevating device for moving said support plate up and down relative to the positioned board.

22. A board positioning apparatus as claimed in claim 19, wherein said support member is a rotary table.

23. A board positioning apparatus as claimed in claim 19, wherein each of said board positioning stations comprises:

a first positioning mechanism for positioning the board in a direction of the plane of the board, said first positioning mechanism including a plurality of positioning pins adapted to be inserted into position regulating holes of the board; and a second positioning mechanism for positioning the board at a reference height, said second positioning mechanism including a frame member for receiving an upper surface of the board, and pressure members for pressing the board against said frame member.

* * * * *